United States Patent [19]
Minne et al.

[11] Patent Number: 6,000,947
[45] Date of Patent: Dec. 14, 1999

[54] METHOD OF FABRICATING TRANSISTOR OR OTHER ELECTRONIC DEVICE USING SCANNING PROBE MICROSCOPE

[75] Inventors: Stephen Charles Minne, Danville, Ill.; Hyongsok Soh; Calvin F. Quate, both of Stanford, Calif.

[73] Assignee: The Board of Trustees of the Leland Stanford, Jr., Stanford, Calif.

[21] Appl. No.: 08/548,307

[22] Filed: Nov. 1, 1995

Related U.S. Application Data

[63] Continuation of application No. 08/297,691, Aug. 26, 1994, abandoned, which is a continuation-in-part of application No. 08/296,340, Aug. 25, 1994, abandoned, which is a continuation-in-part of application No. 08/226,784, Apr. 12, 1994, Pat. No. 5,517,280.

[51] Int. Cl.$^6$ ................................................ H01L 21/465
[52] U.S. Cl. ..................... 437/228; 437/237; 437/239; 437/935; 437/983; 437/186; 437/41
[58] Field of Search .................................... 437/228, 237, 437/239, 983, 935, 41, 186; 148/DIG. 117, 118

[56] References Cited

U.S. PATENT DOCUMENTS

| | | | |
|---|---|---|---|
| 4,479,831 | 10/1984 | Sandow et al. | 148/1.5 |
| 4,724,318 | 2/1988 | Binning | 250/306 |
| 5,138,174 | 8/1992 | Tang | 250/492.3 |
| 5,209,117 | 5/1993 | Bennett | 73/517 R |
| 5,210,410 | 5/1993 | Barrett | 250/234 |
| 5,221,415 | 6/1993 | Albrecht et al. | 156/629 |
| 5,227,626 | 7/1993 | Okada et al. | 250/234 |
| 5,231,286 | 7/1993 | Kajimura et al. | 250/234 |
| 5,254,854 | 10/1993 | Betzig | 250/234 |
| 5,345,815 | 9/1994 | Albrecht et al. | 73/105 |
| 5,354,985 | 10/1994 | Quate | 250/234 |
| 5,406,832 | 4/1995 | Gamble et al. | 73/105 |
| 5,444,244 | 8/1995 | Kirk et al. | 250/306 |
| 5,537,863 | 7/1996 | Fujiu et al. | 73/105 |
| 5,618,760 | 4/1997 | Soh et al. | 438/703 |

FOREIGN PATENT DOCUMENTS

| | | | |
|---|---|---|---|
| 1504-485 | 8/1989 | U.S.S.R. | G01B 5/28 |
| WO 94/29894 | 12/1994 | WIPO . | |

OTHER PUBLICATIONS

Kremer et al "Nonometer lithography on silicon and hydrogenated amorphous silicon with low energy electrons", submitted with IDS for application 08/297,691 on Aug. 26, 1994.

"Integrated optics and new wave phenomena in optical waveguides", P.K. Tien, Reviews of Modern Physics, vol. 49, No. 2, Apr. 1977, pp. 361–362.

"Integrated Acoustooptic Circuits and Applications", Chen S. Tsai, IEEE Transactions on Ultrasonics, Ferroelectrics and Frequency Control, vol. 39, No. 5, Sep. 1992, pp. 529–554.

"Guided–Wave Acousto–Optics Interactions, Devices and Applications", Chen S. Tsai (Ed.), Springer–Verlag, 1990, pp. 79 and 250–256.

"Near–Field subwavelength micropattern generation: Pipette guided argon fluoride excimer laser microfabrication", M. Rudman et al., J. Appl. Phys. 72(9), Nov. 1, 1992, pp. 4379–4383.

(List continued on next page.)

Primary Examiner—John Niebling
Assistant Examiner—Thomas G. Bilodeau
Attorney, Agent, or Firm—Skjerven, Morrill, MacPherson, Franklin & Friel; David E. Steuber

[57] ABSTRACT

A scanning probe microscope is used to fabricate a gate or other feature of a transistor by scanning a silicon substrate in which the transistor is to be formed. An electric field is created between the cantilever tip and the silicon substrate, thereby causing an oxide layer to be formed on the surface of the substrate. As the tip is scanned across the substrate the electric field is switched on and off so that an oxide pattern is formed on the silicon. Preferably, the oxide pattern is formed on a deposited layer of amorphous silicon. Extremely small features, e.g., a MOSFET gate having a length of 0.2 μm or less can be fabricated by this technique.

35 Claims, 20 Drawing Sheets

OTHER PUBLICATIONS

"Optical characteristics of 0.1μm circular apertures in a metal film as light sources for scanning ultramicroscopy", U.Ch. Fischer, J. Vac. Sci. Technol. B 3(1), Jan./Feb. 1985, pp. 386–390.

"Near–field optical microscope using a slicon–nitride probe", N.F. van Hulst et al., Appl. Phys. Lett. 62(5), Feb. 1, 1993, pp. 461–463.

"Near–field optical scanning microscopy in reflection", U.Ch. Fischer, Appl. Phys. Lett. 52(4), Jan. 25, 1988, pp. 249–251.

"Micron–Size Optical Waveguide for Optoelectornic Integrated Circuits", T. Nagata et al., Extended Abstracts of the 1993 International Conference on Solid State Devices and Materials, Makuhari, 1993, pp. 1047–1049.

"A Light Source Smaller Than the Optical Wavelength", K. Lieberman et al., Science, vol. 247, Jan. 5, 1990, pp. 59–61.

"Near–field differential scanning optical microscope with atomic force regulation", R. Toledo–Crow et al., Appl. Phys. Lett. 60(24), Jun. 15, 1992, pp. 2957–2959.

"Near–Field Optics: Microscopy, Spectroscopy, and Surface Modification Beyond the Diffraction Limit", Eric Betzig et al., Science vol. 257, 10 Jul. 1992, pp. 189–195.

"Breaking the Diffraction Barrier: Optical Microscopy on a Nanometric Scale", E. Betzig et al., Science vol. 251, Mar. 22, 1991, pp. 1468–1470.

"Combined shear force and near–field scanning optical microscopy", E. Betzig et al., Appl. Phys. Lett. 60(20), May 18, 1992, pp. 2484–2486.

N. Barniol et al., "Modification of HF–Treated Silicon (100) Surfaces by Scanning Tunneling Microscopy in Air Under Imaging Conditions", Appl. Phys. Lett., vol. 61, No. 4, Jul. 27, 1992, 1992 American Institute of Physics, pp. 462–464.

J.A. Dagata et al., "Modification of Hydrogen–Passivated Silicon by a Scanning Tunneling Microscope Operating in Air", Appl. Phys. Lett., vol. 56, No. 20, May 14, 1990, pp. 2001–2003.

J.A. Dagata et al., Pattern Generation on Semiconductor Surfaces by a Scanning Tunneling Microscope Operating in Air, J. Vac. Sci. Technol. B, vol. 9, No. 2 Mar./Apr. 1991, pp. 1384–1388.

Sugimura, et al., "Maskless Patterning of Silicon Surface Based on Scanning Tunneling Microscope Tip–Induced Anodization and Chemical Etching", Appl. Phys. Lett., vol. 65, No. 12, Sep. 19, 1994, pp. 1569–1571.

Wang et al., "Nanometer–Structure Writing on SI (100) Surfaces Using a Non–Contact–Mode Atomic Force Microscope", Appl, Phys. Lett., vol. 65, No. 11, Sep. 12, 1994, pp. 1415–1417.

Wolf et al., "Silicon Processing for the VLSI ERA vol. 1: Process Technology", Lattice Press, 1986, pp. 209–210.

"Thermomechanical writing with an atomic force microscope tip", H.J. Mamin et al., Appl. Phys. Lett. 61(8), Aug. 24, 1992, pp. 1003–1005.

"The atomic force microscope used as a powerful tool for machining surfaces", T.A. Jung et al., Elsevier Science Publishers, 1992, pp. 1446–1451.

"25 nm chromium oxide lines by scanning tunneling litography in air", H.J. Song et al., 38th Int'l. Symp. on Electron, Ion and Photon Beams, New Orleans, LA, May 31–Jun. 3, 1994, p. 16 pages.

"Nanometer–scale lithography using the atomic force microscope", A. Majumdar et al., Appl. Phys. Lett. 61(19), Nov. 9, 1992, pp. 2293–2295.

"Tip–induced anodization of titanium surfaces by scanning tunneling microscopy: A humidity effect on nanolithography", H. Sugimuar et al., Appl. Phys. Lett. 62(9), Aug. 30, 1993, pp. 1288–1290.

"Nanometer scale patterning of silicon (100) surfaces by an atomic force microscope operating in air", L. Tsau et al., Appl. Phys. Lett. 64(16), Apr. 18, 1994, pp. 2133–2135.

"Fabrication of Si nanostructures with an atomic force microscope", E.S. Snow et al., Appl. Phys. Lett. 64(15), Apr. 11, 1994, pp. 1932–1934.

"Lithographic patterning of self–assembled films", J.M. Calvert, J. Vac. Sci. Technol. B 11(6), Nov. /Dec. 1993, pp. 2155–2163.

"Self–assembled monolayer electron beam resist on GaAs", R.C. Tiberio et al., Appl. Phys. Lett. 62(5), Feb. 1, 1993, pp. 476–478.

"Low voltage electron beam lithography in self–assembled ultrathin films with the scanning tunneling microscope", C.R.K. Marrian et al, Appl. Phys. Lett. 64(3), Jan. 17, 1994, pp. 390–392.

"Scanning Probe Lithography. 1. Scanning Tunneling Microscope Induced Lithography of Self–Assembled n–Alkanethiol Monolayer Resists", C.B. Ross et al., American Chemical Society, Langmuir, vol. 9, No. 3, 1993, pp. 632–636.

"Modification of Silicon Surface Produced by Electric Field Enhanced Oxidation Through Native Oxide", Y. Ejiri et al., Extended Abstracts of 1993 Int'l. Conf. on Solid State Devices and Materials, 1993, pp. 606–608.

"Fabrication of silicon nanostructures with a scanning tunneling microscope", E.S. Snow et al., Appl. Phys. Lett. 63(6), Aug. 9, 1993, pp. 749–751.

"Nanometre–scale chemical modification using a scanning tunnelling microscope", Y. Utsugi, Nippon Telegraph and Telephone Corp., LSI Laboratories, 2 pages, 1991.

"Atomic Force Microscopy Using A Piezoresistive Cantilever", M. Tortonese et al., IEEE, Mar. 1991, pp. 448–450.

"Fabrication of Si nanostructures with an atomic force microscope", E.S. Snow et al., Appl. Phys. Lett. 64(15), Apr. 11, 1994, 12 pgs.

*Technology of proximal probe lithography,* "Principles and Techniques of STM Lithography", M.A. McCord et al, 1993, The Society of Photo–Optical Instrumentation Engineers, pp. 16–32.

*Technology of proximal probe lithography,* "Low Voltage E–Beam Lithography With The STM", C.R.K. Marrian et al, 1993, The Society of Photo–Optical Instrumental Engineers, pp. 58–73.

*Technology of proximal probe lithography,* "The Technology of Proximal Probe Lithography: An Overview", J. A. Dagata et al, 1993, The Society of Photo–Optical Instrumentation Engineers, pp. 3–11.

"Nanometer Lithography on Silicon and Hydrogenated Amouphous Silicon with Low Energy Electrons", Kramer et al., abstract, International Conference on Micro and Nanofabrication, Sep. 1994.

N. Kramer et al., "Fabrication of Metallic Nanowires with a Scanning Tunneling Microscope", 1995 American Institute of Physics, Appl. Phys. Lett. 66 (11), Mar. 13, 1995, pp. 1325–1327.

"Silicon transfer layer for multilayer resist systems", J.B. Kruger et al., J.Vac. Sci. Technol., 19(4), Nov./Dec. 1981, pp. 1320–1324.

METHOD OF FABRICATING TRANSISTOR OR OTHER ELECTRONIC DEVICE USING SCANNING PROBE MICROSCOPE

This application is a continuation of application Ser. No. 08/297,691, filed Aug. 26, 1994, abandoned, which is a continuation-in-part of application Ser. No. 08/296,340, filed Aug. 25, 1994, now abandoned, which is incorporated herein by reference in its entirety and which is a continuation-in-part of application Ser. No. 08/226,784, filed Apr. 12, 1994, now U.S. Pat. No. 5,517,280.

This invention was made with Government support under Contract No. N00014-91-J-1050-P00006, awarded by the Office of Naval Research, Department of the Navy. The Government has certain rights in this invention.

FIELD OF THE INVENTION

This invention relates to the fabrication of transistors and other electronic devices and, in particular, to the fabrication of a transistor such as a metal-oxide-silicon field-effect-transistor (MOSFET) using a scanning probe microscope.

BACKGROUND OF THE INVENTION

The progress of integrated circuit technology has been marked by a continuing reduction in the size of individual devices on each semiconductor chip. Smaller devices yield the dual advantages of greater packing density and increased speed. One of the principal problems currently facing engineers and scientists in the integrated circuit (IC) field is the development of techniques for defining smaller features on the surface of the chip. As is well known, features have conventionally been defined using a photoresist which is exposed, through a mask, to some form of light radiation. Initially, visible light was used, but the desire for smaller feature size has led to the use of UV light and x-rays. However, the minimum feature size that is feasible using optical lithography is approximately 0.2 $\mu$m. Currently, development efforts are under way to achieve a transistor which has a gate length of 0.2 $\mu$m or less. Thus, a technique is needed for defining features having sizes within this range.

SUMMARY OF THE INVENTION

In accordance with this invention, a feature of a transistor or other electronic device is defined on the surface of a substrate using an electric field generated at the tip of a cantilever in a scanning probe microscope (SPM). The electric field is generated by fabricating a conductive path extending to the tip of the cantilever and applying a voltage to the conductive path. The tip is biased to a first voltage and the substrate is biased to a second voltage (either of which may be ground voltage). The tip is then scanned over the surface of the substrate, preferably in a raster pattern.

The surface of the substrate is typically formed of silicon or a metal, preferably amorphous silicon or polysilicon. The electric field at the tip of the cantilever causes an oxide pattern to form on the surface of the substrate, and the substrate is then etched using an etchant which does not attack the oxide. In this manner, a line having a width as small as 0.01 $\mu$m may be formed and a corresponding feature may be formed on the surface of the substrate.

This technique may be used to define various features of different kinds of transistors. In a preferred embodiment, the technique is used to define the gate of a metal-oxide-silicon field-effect-transistor (MOSFET). A layer of amorphous silicon is deposited on a gate oxide layer, and the gate is defined using an electric field generated at the tip of an SPM cantilever. The gate is formed by etching the layer of amorphous silicon. A MOSFET fabricated by means of this method is extremely small and fast, and may have a gate length of 0.2 $\mu$m or less. In another embodiment a gate contact pad adjoining the gate is also formed with the scanning tip, and this eliminates the need for a photomask at this stage.

In accordance with another aspect of this invention, the oxide pattern formed using the scanning tip is itself used as a feature of a transistor or other electronic device.

The cantilever may function in the manner of an atomic force microscope operating in either the contact mode or the non-contact or attractive mode. That is, the tip of the cantilever is brought very close to the surface of the substrate and is vibrated at its resonant frequency. Since the tip of the cantilever is located extremely close to the surface of the substrate, the resonant frequency of the cantilever is determined in part by Van der Waals forces or other forces which exist between the tip and the surface. In reality, it is the gradient of the forces that changes the resonant frequency. As the gap between the tip and the surface changes, these forces vary, and this variation in turn alters the resonant frequency of the cantilever.

The resonant frequency of the cantilever is detected, and a feedback system adjusts the distance between the tip and the surface so as to maintain the resonant frequency at a constant value. As a result, the gap between the surface of the substrate and the tip of the cantilever is held constant. This gap must be controlled very precisely to ensure that only the desired area of the substrate is exposed to the electric field. Alternatively, the amplitude of the oscillations of the cantilever can be detected, and this information can be used to control the gap between the surface of the substrate and the tip of the cantilever.

The cantilever is preferably vibrated by means of a piezoelectric element embedded within the cantilever. Superimposed AC and DC signals are applied to the piezoelectric element. The AC component causes the cantilever to vibrate and the DC component regulates the neutral position of the cantilever relative to the surface of the substrate.

The vibration of the cantilever is detected by means of a piezoresistor which is embedded in the cantilever in such a way that its resistance varies as the cantilever bends. The resistance of the piezoresistor is detected, and this provides a signal indicative of the resonant frequency of the cantilever. Using this information, the feedback system is used to control the gap between the tip and the surface of the substrate.

The feedback loop contains the following elements. The piezoresistor is used to detect the vibrational frequency of the cantilever and delivers an output which is compared to a voltage level which represents the desired spacing between the tip and the surface of the substrate. If the spacing, represented by the vibrational frequency of the cantilever, is not correct, an error signal is generated, and this error signal is delivered to circuitry which adjusts the DC component of the signal applied to the piezoelectric element. This in turn produces a change in the spacing between the tip and the surface until the error signal is reduced to zero.

The technique of this invention may be performed with various kinds of SPMs, including atomic force microscopes (AFMs) and scanning tunneling microscopes (STMs).

BRIEF DESCRIPTION OF THE DRAWINGS

FIGS. 3A–3Z and FIGS. 3A-1, 3A-2, 3A-3, 3A-4, 3A-5 and 3A-6 illustrate steps in the process of fabricating a cantilever for use in the method of this invention.

FIG. 6 illustrates a detailed cross-sectional view of a cantilever tip on which an electrical charge is stored.

DESCRIPTION OF THE INVENTION

Figure 1:
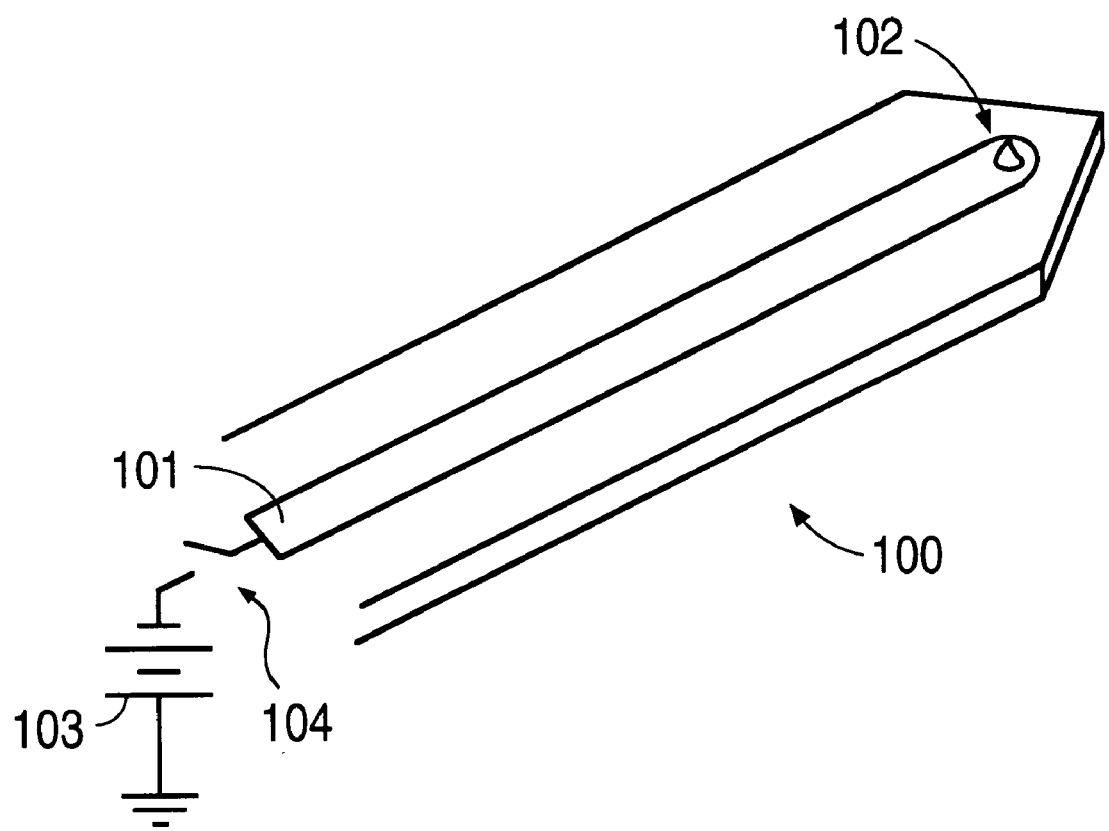
FIG. 1 illustrates a general view of a cantilever used for performing lithography by means of an electric field.

FIG. 1 illustrates a simplified schematic diagram of a cantilever 100 of an atomic force microscope (AFM) in accordance with this invention. An electrical conductive path 101 extends from the base of cantilever 100 to a conductive tip 102. Conductive path 101 may comprise, for example, a metallic coating applied to cantilever 100 or a region of doped semiconductor material within cantilever 100. By means of conductive path 101, tip 102 is biased with respect to the substrate which is to be patterned. A voltage source 103 is provided to supply a voltage to tip 102 via path 101, or the voltage source may be connected to the substrate. A switch 104 may be provided in conductive path 101. Lithography is performed by means of an electric field which is formed at tip 102.

To perform lithography with cantilever 100, a silicon surface is oxidized to form an etch stop. Preferably a layer of amorphous silicon is used for this purpose, although polysilicon or silicon may also be used. The amorphous silicon layer may be deposited by chemical vapor deposition (CVD), plasma enhanced chemical vapor deposition (PECVD), low pressure chemical vapor deposition (LPCVD), sputtering or evaporation. In the preferred method, the silicon surface is passivated by cleaning it and dipping it in a solution containing hydrogen (e.g., a 10:1 deionized water:hydrofluoric acid solution). Hydrogen from the solution bonds to dangling bonds on the silicon surface and forms a passivating monolayer free from the dangling silicon bonds. The passivated surface is exposed to an intense electric field from tip 102 in the presence of water vapor or oxygen. The electric field disrupts the bond between the silicon and hydrogen atoms and thereby exposes a fresh silicon surface. The molecules of water vapor are activated by the electric field, and the free oxygen that results from this activation process combines with the exposed silicon atoms to form an oxide layer. This process is described in E. S. Snow et al., "Fabrication of Si nanostructures with an atomic force microscope", Appl. Phys. Lett. 64 (15), Apr. 11, 1994, pp. 1932–1934, which is incorporated herein by reference.

Unpassivated silicon surfaces grow a thin layer of native oxide when exposed to air. If the above described electric field-enhanced oxidation process is carried out on an oxidized silicon surface, the thickness of the oxide in the region exposed to the electric field will increase, and this thick oxide may be used as an etch stop. This process is described in L. Tsau et al., "Nanometer scale patterning of silicon (100) surfaces by an atomic force microscope operating in air", Appl. Phys. Lett. 64 (16), Apr. 18, 1994, pp. 2133–2135, which is incorporated herein by reference.

Certain metals, such as aluminum, chromium and titanium, are also oxidized by an intense electric field in the presence of water molecules. It is believed that the intense electric field disassociates the water molecules and frees the oxygen to interact with the metal surface to form an oxide. Chromium oxide or dioxide is formed on a chromium surface and titanium oxide is formed on a titanium surface. The oxidation of chromium is described in H. J. Song et al., "25 nm chromium oxide lines by scanning tunneling lithography in air," presented at the 38th International Symposium on Electron, Ion and Photo Beams, New Orleans, La., May 31–Jun. 3, 1994, and the oxidation of titanium is described in H. Sugimura, "Tip-induced anodization of titanium surfaces by scanning tunneling microscopy; A humidity effect on nanolithography", Appl. Phys. Lett. 63 (9), Aug. 30, 1993, pp. 1288–1290, both of which are incorporated herein by reference.

Cantilever 100 is scanned over the surface of a silicon substrate, preferably in a raster pattern. The AFM may be operated in the contact mode, with the tip 102 in contact with the silicon surface. Since the silicon substrate is grounded (or connected to some other reference voltage different from the voltage applied to tip 101), an electric field is formed between tip 101 and the surface of the substrate. As described above, this causes a layer of oxide to be formed on the surface of the substrate. Alternatively, the probe may be used in the non-contact mode.

As cantilever 100 is scanned over the silicon surface, the application of the electric field to the silicon surface is controlled, thereby causing the surface to be oxidized only in regions where an etch stop is desired. The electric field at tip 102 may be controlled either by providing a switch in conductive path 101 or by lifting cantilever 100 from the surface of the silicon substrate. Circuitry for controlling the electric field in these ways is described below in conjunction with FIGS. 5A and 5B.

Figure 2A:
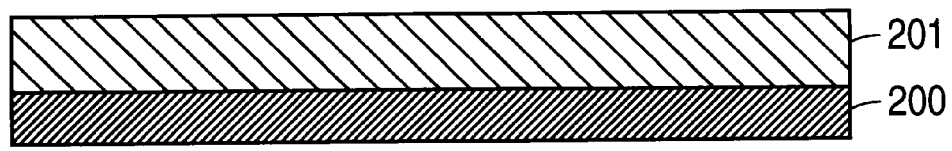
FIGS. 2A–2Q illustrate steps of fabricating the gate of a MOSFET in accordance with this invention.
Figure 2B:
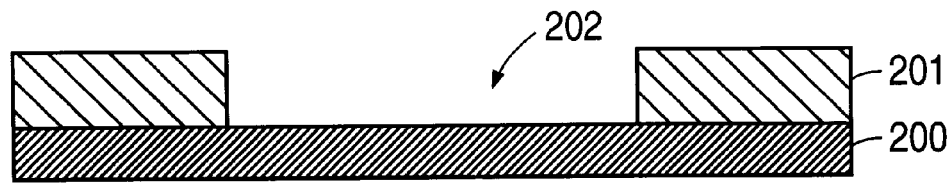

The fabrication of a MOSFET in accordance with this invention will now be described with reference to FIGS. 2A–2P. FIG. 2A shows a silicon substrate 200 and an overlying field oxide layer 201, which is preferably about 5200 Å thick. Silicon substrate 200 is initially cleaned, and field oxide layer 201 is grown using conventional techniques. Substrate 200 is <100> p-type silicon having a resistivity of 0.1 ohm-cm.

Using a conventional masking technique, an active device area 202 is formed. Field oxide layer 201 is etched with an HF (6:1) solution for 6.0–6.5 minutes. A wet etch is used instead of a reactive ion etch (RIE), to create a smooth slope on the side walls of the field oxide layer 201. As described below, this makes it easier to pattern the device using an AFM tip. The resulting structure is shown in FIG. 2B. If desired, a threshold implant oxide (not shown) may be grown on the exposed surface of substrate 200, and a threshold voltage adjust implant may be performed using a known process, after which the threshold implant oxide is stripped.

Figure 2C:
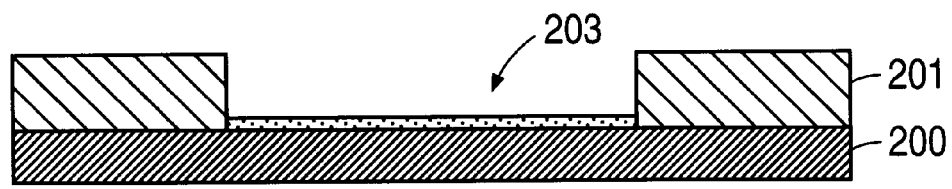
Figure 2D:
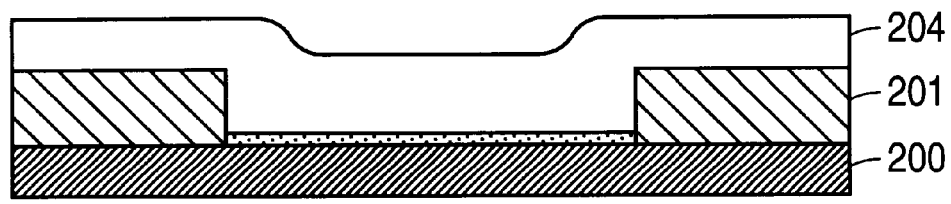

The substrate 200 is then cleaned, and a gate oxide layer 203 is thermally grown, as shown in FIG. 2C. In one embodiment, gate oxide layer 203 is 75 Å thick and is formed with a 25 minute dry oxidation at 850° C. Next, as shown in FIG. 2D, a layer 204 of amorphous silicon is deposited on the surface of the structure. A low pressure chemical vapor deposition (LPCVD) process is used to deposit the amorphous silicon to a thickness of approximately 1000 Å. The process is carried out at a temperature of 560° C.

Figure 2E:
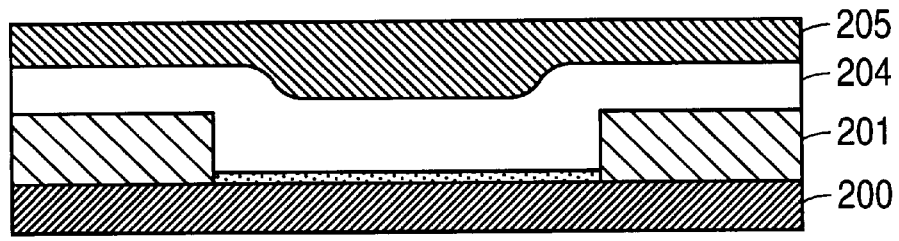
Figure 2F:
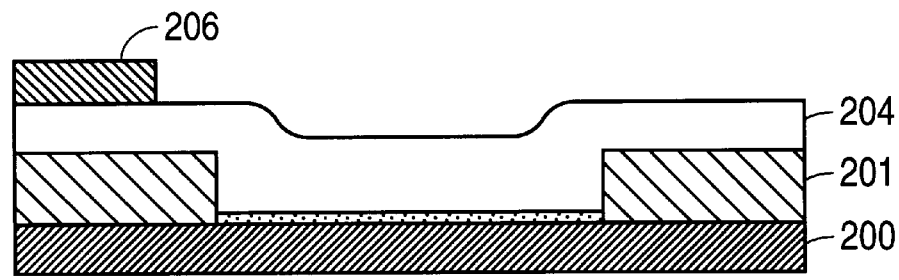

As shown in FIG. 2E, a layer of photoresist 205 is deposited on the surface of the amorphous silicon layer 204.

Photoresist layer 205 is then patterned using conventional photolithographic techniques to form a gate contact pad region 206, shown in the cross-sectional view of 2F and the plan view of 2G. The portion of resist layer 205, which forms gate contact pad region 206, is left in place.

Figure 4A:
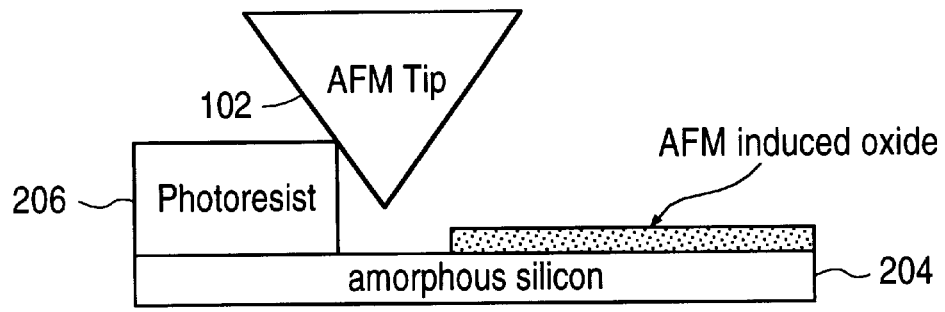
FIG. 4A illustrates the lifting of the cantilever tip from the surface of the substrate when the tip encounters a steep feature on the substrate.

In the contact mode, the cantilever tip should remain in contact with the surface to be lithographed. Therefore, because the tip has a finite width, any large, steep edges on the surface of the structure should be avoided. As shown in FIG. 4A, a thick layer of photoresist having steep edges may cause an AFM tip to leave the surface of the silicon. Where this happens, the oxide layer will not be formed and the surface of the silicon will not be properly lithographed.

To avoid this problem, a photoresist having a low viscosity is applied in a spin coating machine at a high speed of rotation. The photoresist is AZ14-17 applied at 5000 rpm for 40 seconds. This yields a photoresist layer 205 having a thickness of approximately 0.3 $\mu$m. Advantageously, the amorphous silicon surface is cleaned in an oxygen plasma after the patterning of the photoresist. An oxygen flow rate of 100 sccm, at a pressure of 150 mTorr and RF power of 500 W for 2 minutes may be used. The oxygen plasma provides a controlled way to thin the photoresist further.

Figure 4B:
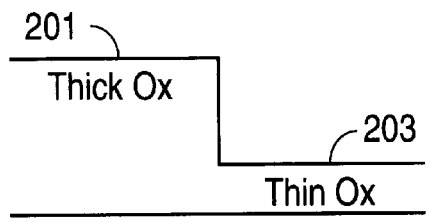
FIGS. 4B–4D illustrate a method of "smoothing" sharp features by depositing a conformal oxide.
Figure 4C:
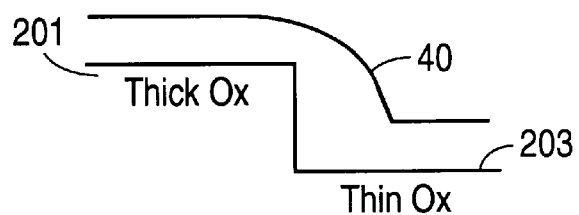
Figure 4D:
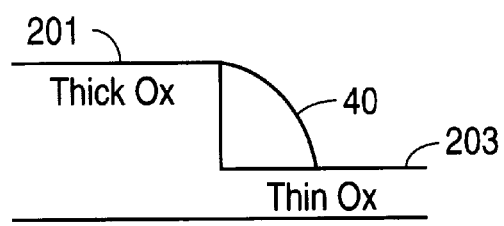

A similar problem can occur at the sharp step between field oxide layer 201 and gate oxide layer 203 (see FIG. 2C). This step may be transmitted to the overlying amorphous silicon layer 204 (FIG. 2D) and can result in a sharp, steep profile which will lift the tip from the amorphous silicon as it traverses the step. To overcome this problem, the step between oxide layers 201 and 203 can be graded by depositing a conformal oxide over the entire surface and then etching it away. The thickness of the conformal oxide layer varies in the region of the sharp step, and subsequent removal of the conformal oxide will produce a "smoothing" effect. A single step is illustrated in FIGS. 4B–4D, showing a conformal oxide layer 40. FIG. 4C shows the conformal oxide layer 40 before etching and FIG. 4D shows the conformal oxide layer 40 after etching. This process may be repeated several times, if necessary, to further reduce the size and steepness of the step.

The problem of tip lift-off at the edge of the field oxide layer may also be reduced by using a thin (e.g., 1000 Å) field oxide region or by using a local oxidation of silicon (LOCOS) process to form the field oxide layer. As described in Muller and Kamis, "Device Electronics For Integrated Circuits", 2nd Edition, Wiley & Sons (1986), pp. 97–98, incorporated herein by reference, the edges of a field oxide region formed by a LOCOS process are tapered, and this minimizes the chances of tip lift-off.

After the formation of gate contact pad region 206, the structure is now ready for lithography using the AFM. Initially, the AFM is used in a conventional imaging mode to determine the location of the active area 202 and the desired location of the gate. In one example, the tip of the cantilever was biased at 20 V and was scanned at a frequency of 0.01 Hz in the direction shown in FIG. 2G for 10 minutes. The tip therefore made six passes (both directions), and in this process formed an oxide region 207 having a width W of 55 $\mu$m and a length L of 0.7 $\mu$m (see FIG. 2G). The rate at which the tip passes over the substrate (scan rate) is determined by the scan length and the scan frequency. The required scan length is determined by the width of the device, plus the distance from the gate region to the gate pad, plus any overlap that is desired. For example, a 30 $\mu$m device with the gate pad 10 $\mu$m away, would have a scan length of 50 $\mu$m if 5 $\mu$m of overlap is desired at the contact pad and the opposite end of the gate. The scan rate and frequency are determined by the quality and thickness of the line desired for the particular application. For example, if a scan rate of 0.5 $\mu$m/sec will produce an adequate line in a single pass, then a 50 $\mu$m scan will take 100 seconds. Since a single pass corresponds to half a period, the full period is 200 seconds, and the scan frequency is 0.005 Hz. In the future, scan rates may increase to the range of centimeters per second.

The width W of the oxide region 207 might be in the range of less than 1 $\mu$m to 75 $\mu$m. The width of the device determines how much current the device can pass. One reason for reducing the gate length is to improve the current carrying capacity of the transistor per unit of width. If a device can be made to carry more current, it can be reduced in width for a particular application. This in turn increases the packing density of transistors on the chip.

Figure 2H:
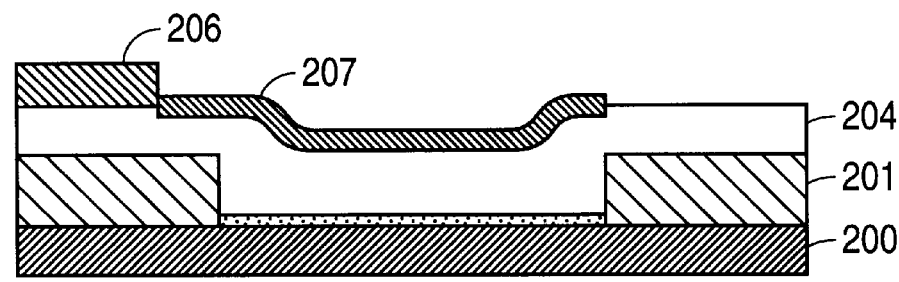
Figure 2I:
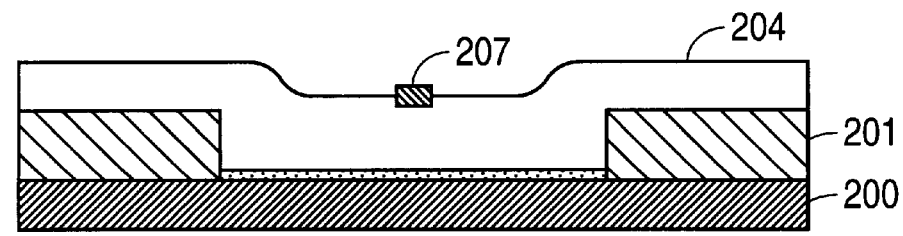
Figure 2G:
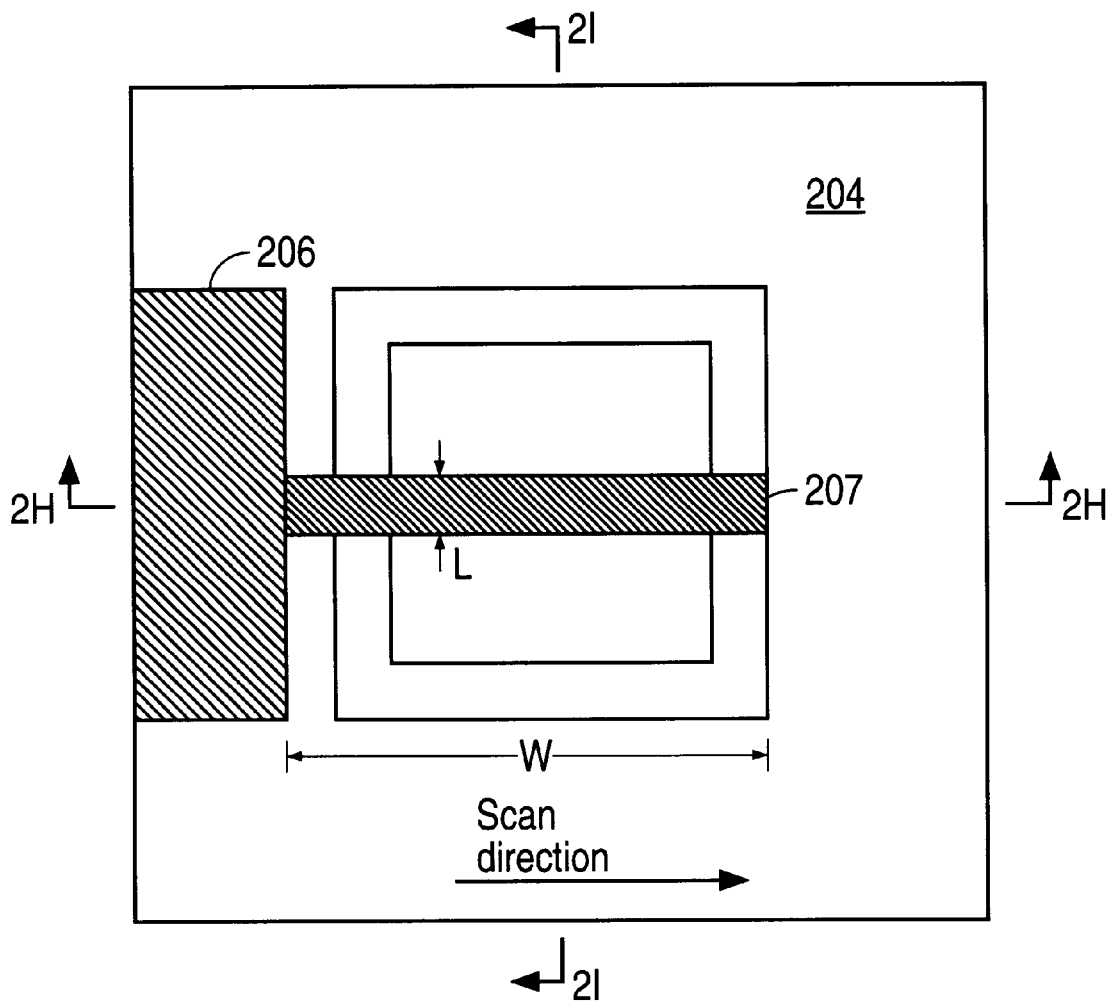

A cross-sectional view taken at section 2H—2H (FIG. 2G) is shown in FIG. 2H, and a view taken at section 2I—2I (FIG. 2G) is shown in FIG. 2I. As shown in FIGS. 2G and 2H, it is important that one end of oxide region 207 be joined with gate contact pad region 206.

Amorphous silicon layer 204 is then etched, using an etchant which does not attack the resist which is used to define the gate contact pad region 206 or the oxide which defines the gate. A dry etch process using 50 sccm $SF_6$, 50 sccm Freon 115, at 150 mTorr with 300 W RF power is preferred. This plasma etches amorphous silicon at roughly 3700 Å/minute and oxide at 100 Å/minute.

Figure 2J:
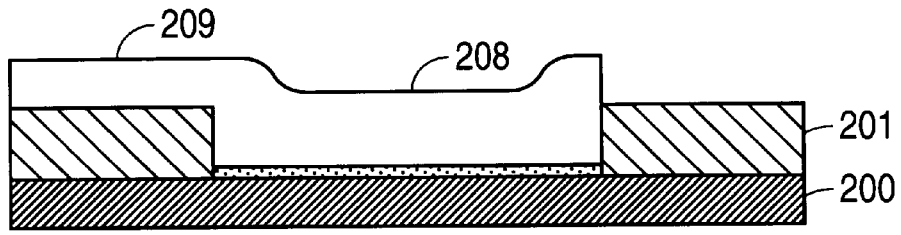
Figure 2K:
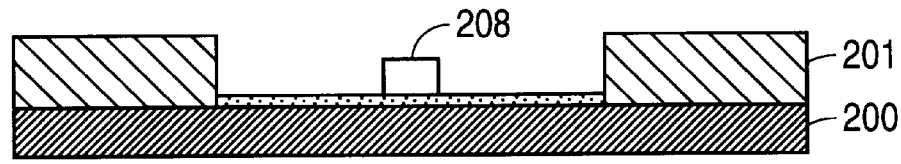

The resulting gate 208 is illustrated in FIGS. 2J and 2K. FIG. 2J also shows a portion of the gate contact pad 209. FIGS. 2J and 2K are taken at cross sections 2H—2H and 2I—2I, respectively, shown in FIG. 2G. The photoresist used to form gate contact pad is then removed. The oxide region 207 may also be removed if desired, but this is not necessary.

Figure 2L:
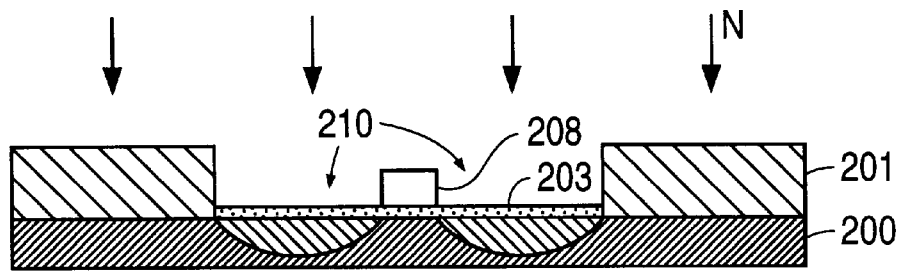

Next, as shown in FIG. 2L, source/drain regions 210 are formed in silicon substrate 200 using conventional processes. Singly ionized arsenic atoms may be implanted, for example, at an energy of 20 keV and a dosage of $1 \times 10^{15}$ ions/cm$^2$. The structure is then annealed at 1000° C. for 10 seconds to convert the amorphous silicon in gate 208 to polysilicon and further annealed at 800° C. for 40 minutes to repair damage to the silicon substrate caused by the implant.

Figure 2M:
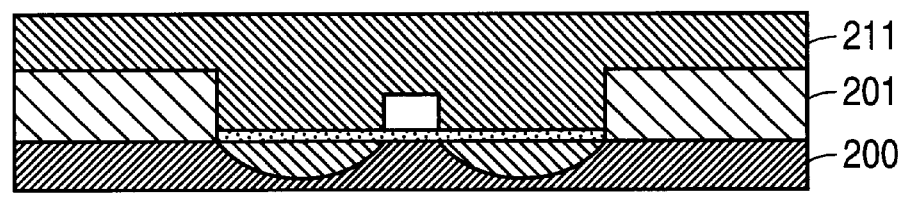
Figure 2N:
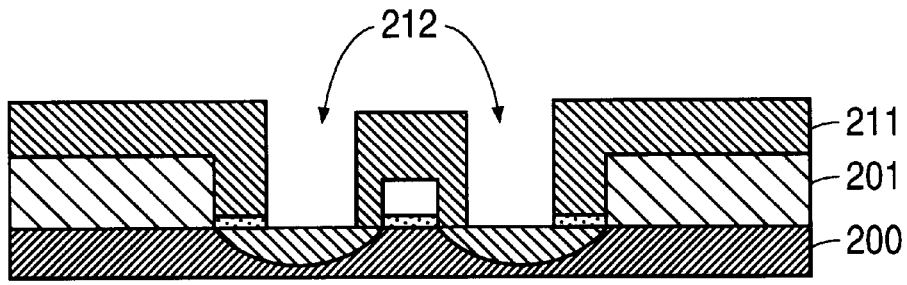
Figure 2O:
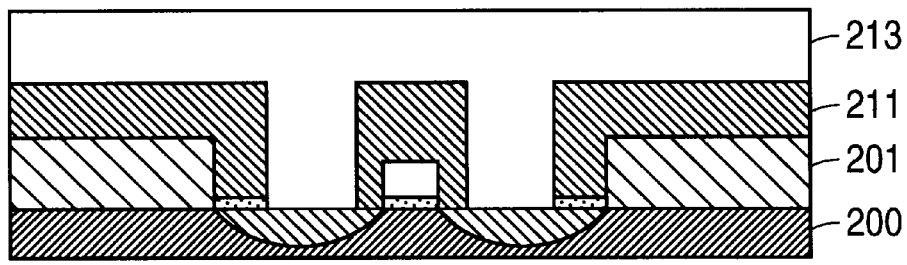
Figure 2P:
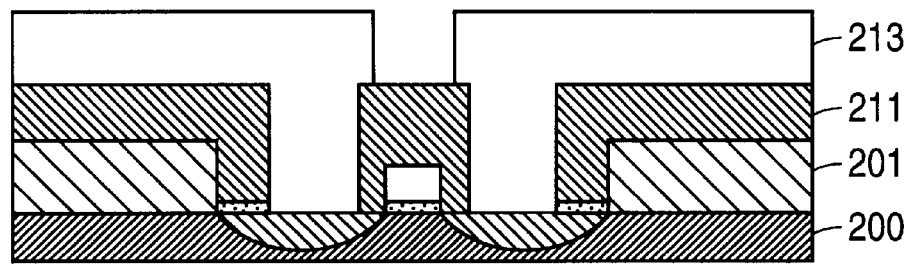
Figure 2Q:
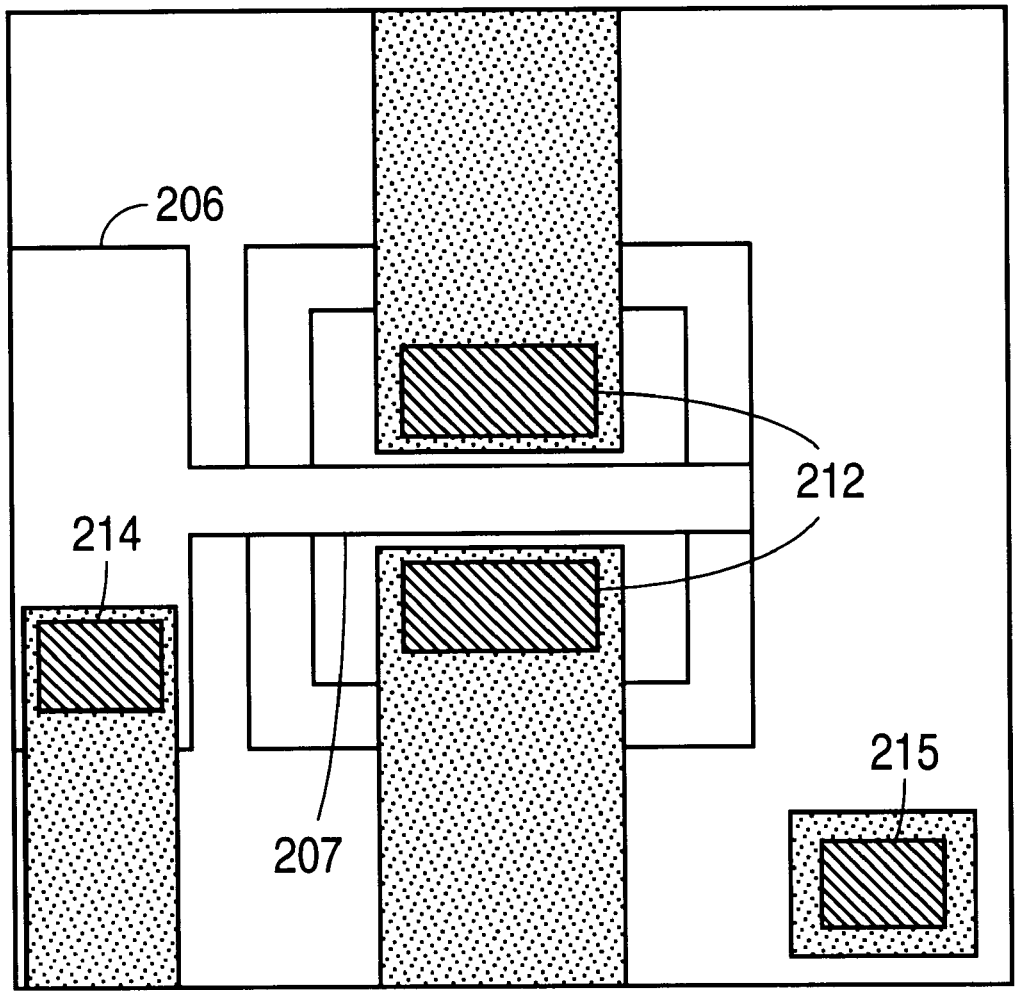

The structure is then covered with a passivation layer 211 consisting of low temperature oxide and borophosphorosilicate glass, as shown in FIG. 2M. Passivation layer 211 is patterned to open contact holes 212 to source/drain regions 210 (FIG. 2N) and an aluminum layer 213 is sputtered on (FIG. 2O) and patterned (FIG. 2P) to form metal contacts to source/drain regions 210. Similarly, a contact hole 214 is opened to the gate contact pad 206 and a contact hole 215 is opened to the silicon substrate 204. FIG. 2Q shows a plan view of this structure.

Numerous alternatives of the foregoing process are feasible. For example, instead of using a thermal process to form the gate oxide (FIG. 2C), the gate oxide could be formed by scanning the tip over the silicon substrate. The electric field at the tip desorbs the passivating layer on the silicon surface and allows for oxidation of the region scanned. In this way, an extremely thin, uniform gate oxide layer may be formed at room temperature, thereby eliminating many of the variations associated with a high temperature oxidation process. Moreover, the gate oxide may be tested immediately after growth for both electrical thickness and actual thickness, using the AFM in its imaging mode.

The early detection of the quality and uniformity of gate oxide layers has the potential of dramatically improving the cost and yield of IC devices.

This method of forming an oxide layer could be used to produce other features of an electronic device, such as an insulating layer of a capacitor.

Another variation of the process is to use the scanning tip to form the gate contact region in lieu of the standard photolithography process described above (FIGS. 2E–2G).

In some embodiments, it is desirable to use a cantilever which has an element for detecting the bending of the cantilever (preferably a piezoresistor embedded in the cantilever) and an element which causes the cantilever to bend (preferably a piezoelectric element formed on the cantilever). This enables the system to maintain a constant force between the tip of the cantilever and the surface with which it is in contact, and also may allow the cantilever to be lifted from the surface. Also, as described above, the cantilever preferably has a conductive path which may be used to connect a voltage source to the tip of the cantilever.

If the cantilever is being operated in the contact mode, the deflection detector senses the bending of the cantilever and the bending element causes the cantilever to bend such that a constant force is maintained between the tip and the surface as the cantilever passes over undulations in the surface of the substrate.

In the non-contact mode, a superimposed AC/DC signal is applied to the bending component, the AC signal being used to cause the cantilever to vibrate and the DC signal controlling the deflection (neutral position) of the cantilever. The deflection detector senses the frequency at which the cantilever vibrates. If the vibrational frequency of the cantilever departs from a desired level, indicating that the gap between the tip and substrate is incorrect, the bending element is adjusted to bring the cantilever back to a proper tip-substrate separation. In the case of a piezoelectric element, this adjustment is made by varying the DC signal that is applied to the element.

Figure 3A:
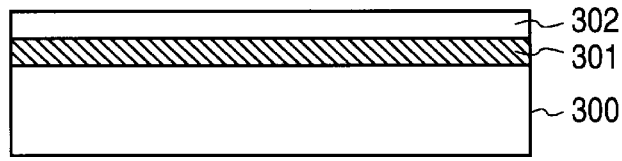
Figure 3B:
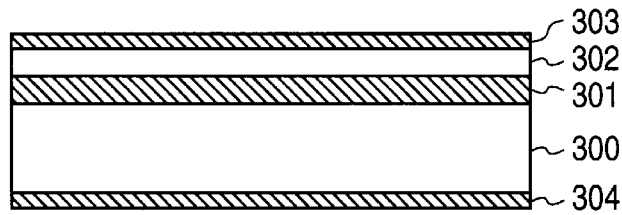
Figure 3C:
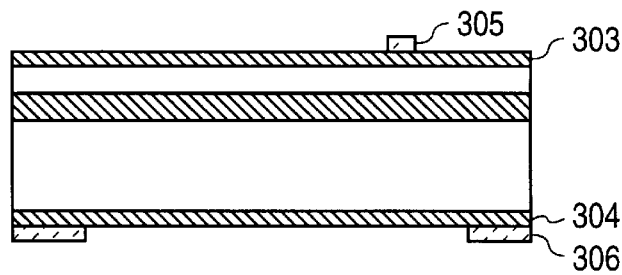
Figure 3D:
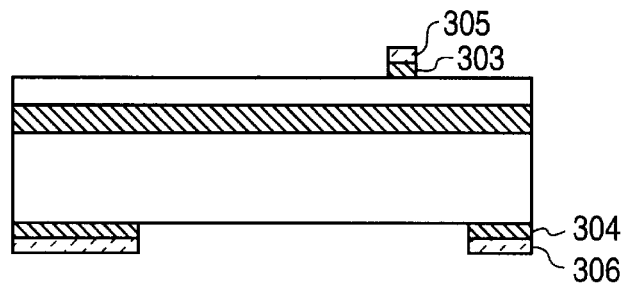
Figure 3E:
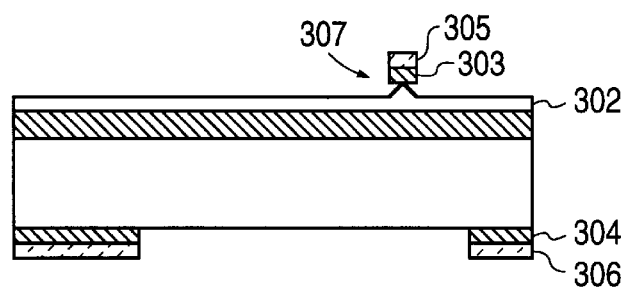
Figure 3X:
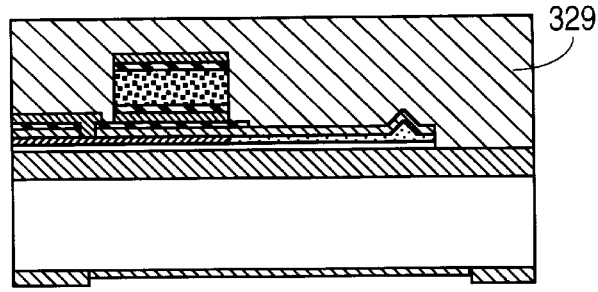
Figure 3Y:
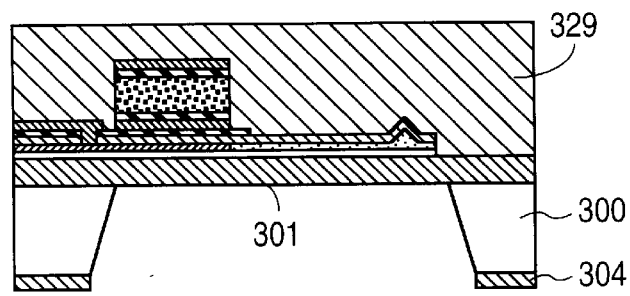
Figure 3Z:
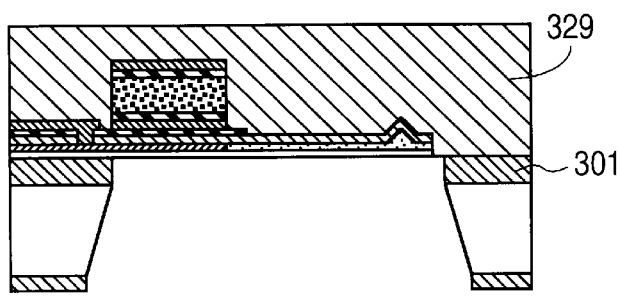
Figures 1, 3A:
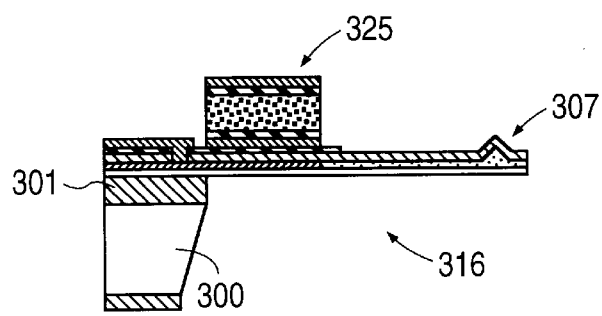

FIGS. 3A–3Z and FIG. 3A-1 illustrate a process of fabricating such a cantilever. It will be apparent that FIGS. 3A–3Z and FIG. 3A-1 are not drawn to scale, the vertical axis being expanded to allow the various layers of the cantilever to be clearly shown.

The starting point is a <100> silicon-on-insulator (SOI) wafer which includes a silicon substrate 300, a middle oxide layer 301 and a top silicon layer 302. In a preferred embodiment, silicon substrate 300 is 450 $\mu$m thick, middle oxide layer 301 is 1 $\mu$m thick, and top silicon layer 302 is 10 $\mu$m thick. As shown in FIG. 3B, oxide layers 303 and 304, preferably 1 $\mu$m thick, are grown on the top and bottom of the structure. This may be accomplished by wet oxidation at 1100° C. for 2 hours and 25 minutes. As shown in FIGS. 3C and 3D, oxide layers 303 and 304 are patterned with photoresist layers 305 and 306 and etched. The etching process may be performed in a 6:1 buffered oxide etch (BOE) solution for ten minutes.

Figures 3, 3A:
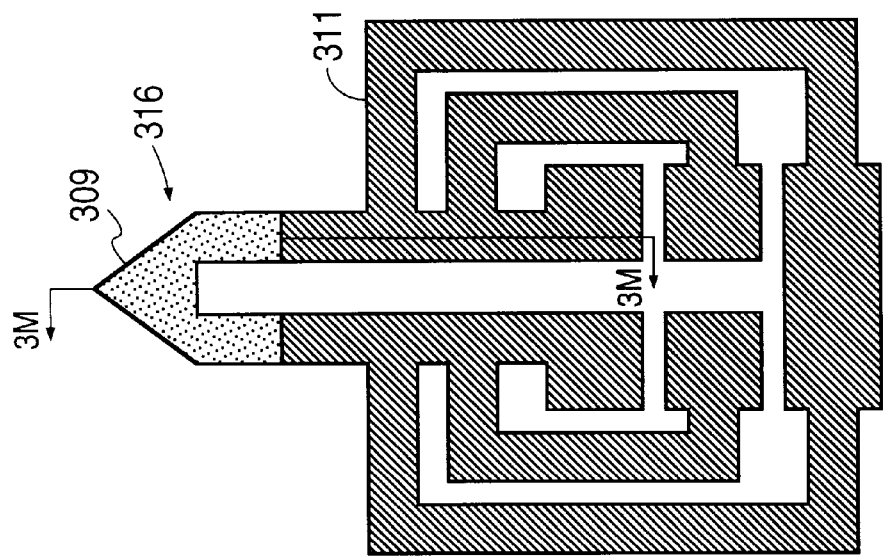
Figures 2, 3A:
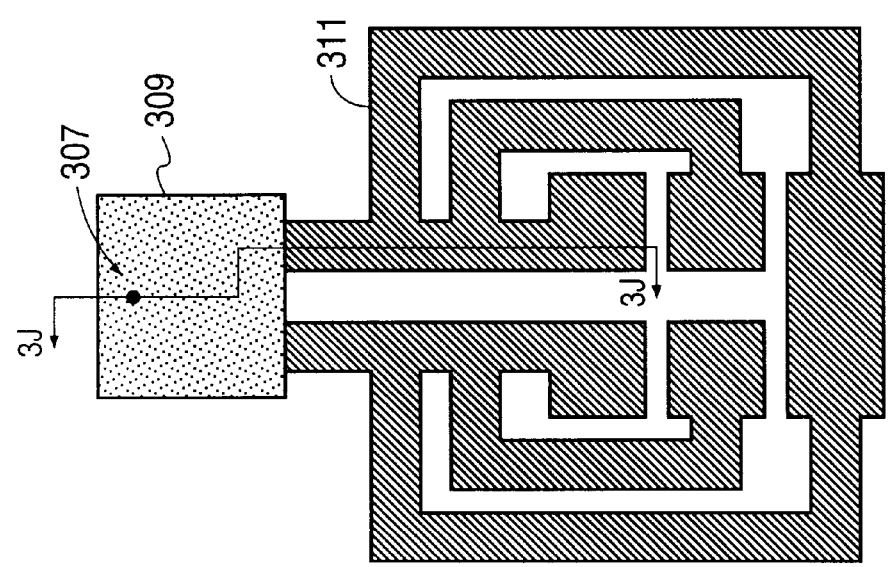
Figures 3, 3A, 4, 5:
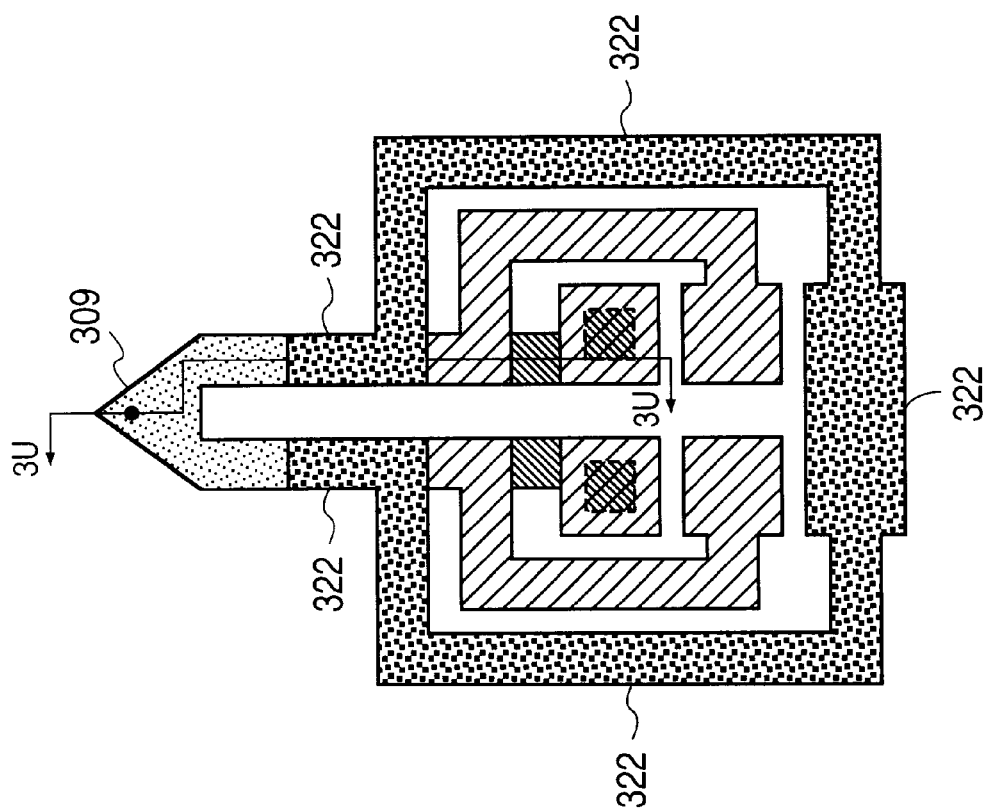
Figures 3, 3A, 4:
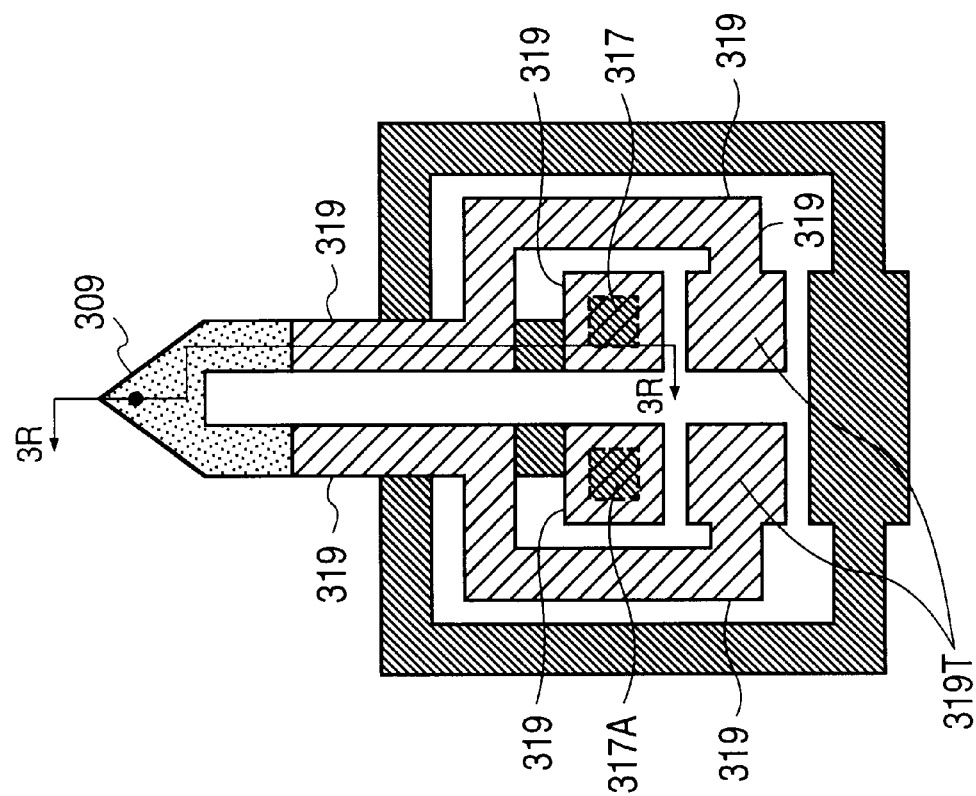
Figures 3, 3A, 4, 5, 6:
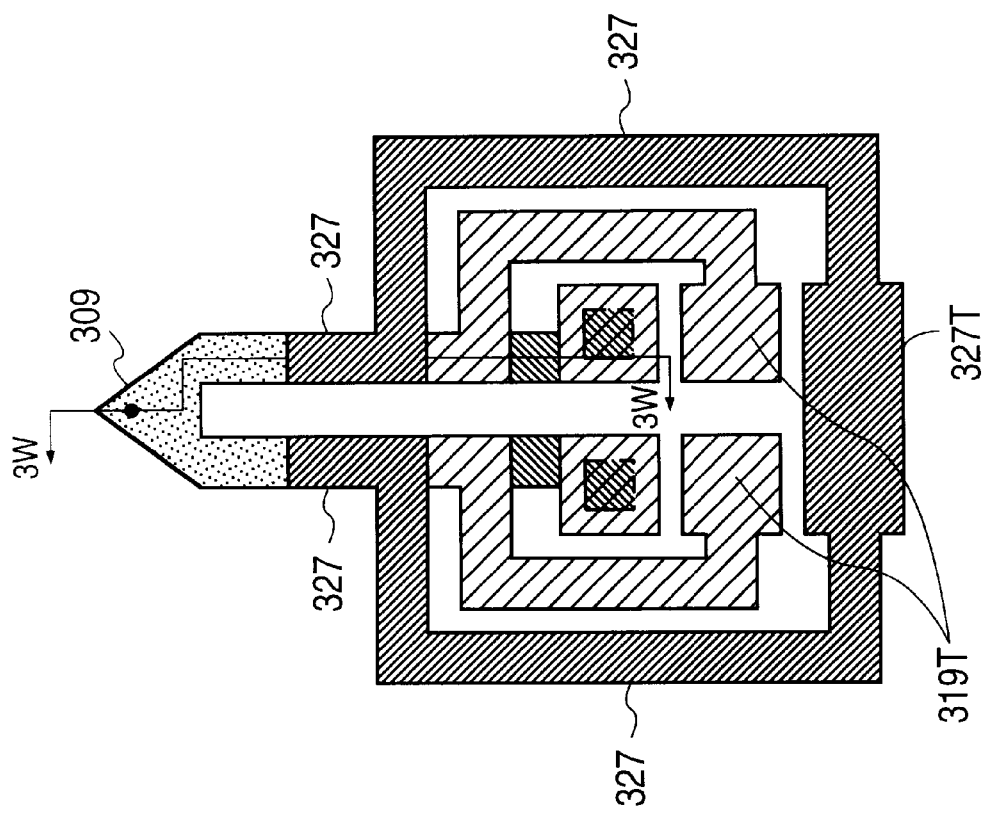
Figure 3F:
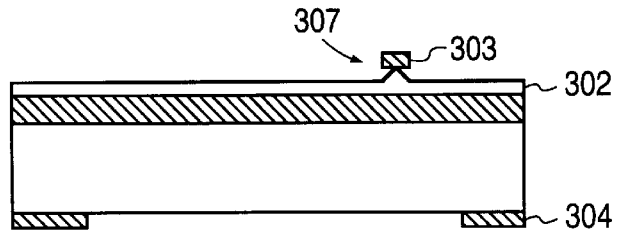
Figure 3G:
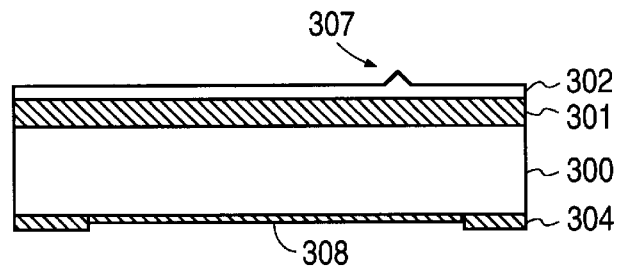

As shown in FIGS. 3E and 3F, top silicon layer 302 is etched, forming a tip 307 beneath the remains of oxide layer 303 and photoresist layer 305, and photoresist layers 305 and 306 are stripped. Top silicon layer 302 is then repeatedly oxidized and etched to sharpen tip 307. This may be accomplished by growing a wet oxide at 950° C. for 40 minutes and etching the oxide layer. This process also forms a new oxide layer 308 on the bottom of the structure having a thickness of about 0.79 $\mu$m.

Figure 3H:
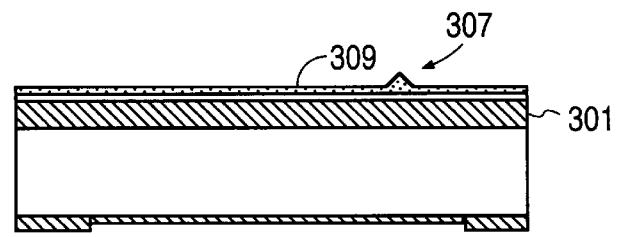
Figure 3I:
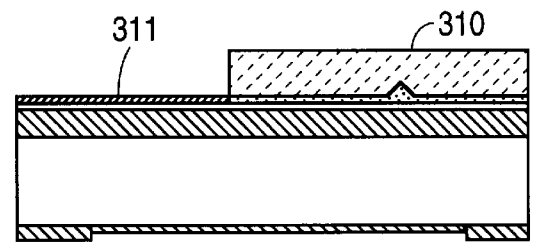
Figure 3J:
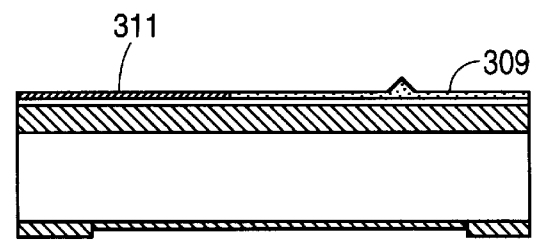

As shown in FIG. 3H, the top surface of the structure is implanted with P-type dopant to form a piezoresistor 309 which extends to the tip 307. This is preferably accomplished with boron ions at a dosage of $5\times10^{14}$ cm$^{-2}$ and an energy of 80 keV. As shown in FIG. 3I, the top surface of the structure is then patterned with a thick photoresist layer 310 that protects the tip 307, and a P-type dopant is implanted to form a P+ conductive region 311. Photoresist layer 310 is preferably AZ4620 photoresist. The implantation of the P-type dopant is accomplished with boron ions at a dosage of $5\times10^{16}$ cm$^{-2}$ at an energy of 80 keV. Thus the first P-type implantation described in FIG. 3H forms a piezoresistor, and the second P-type implantation described in FIG. 3I forms a conductive element. Photoresist layer 310 is then stripped, as shown in FIG. 3J, leaving the piezoresistor 309 and the conductive region 311. FIG. 3A-2 is a plan view showing the shape of piezoresistor 309 and conductive region 311. Cross section line 3J—3J shows the section at which the view of FIG. 3J is taken.

Figure 3K:
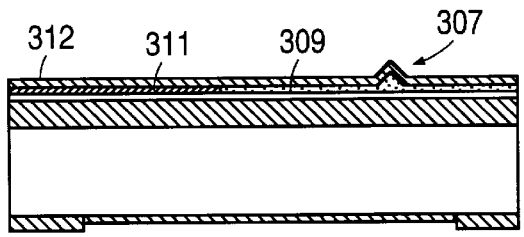
Figure 3L:
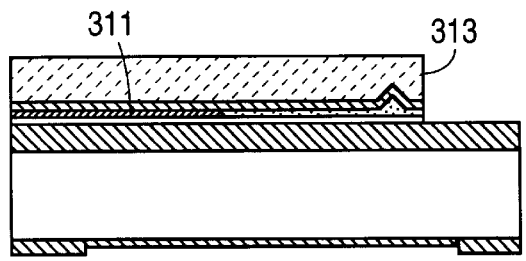

Next, as shown in FIG. 3K, a thin oxide layer 312 is grown on the top surface of the structure. Oxide layer 312 may be grown by a wet process at 900° C. for ten minutes to achieve a thickness of 270 Å. If desired, oxide layer 312 may be removed from the region of the tip 307 in an additional photolithographic step.

Figure 3M:
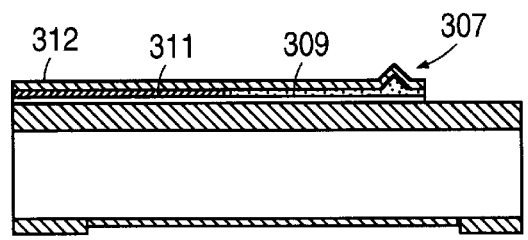
Figure 3N:
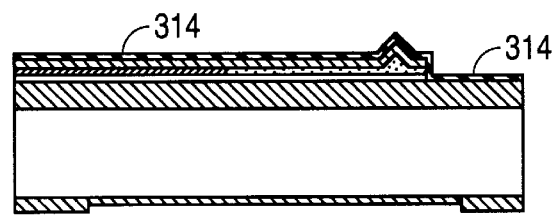

A photoresist layer 313 is deposited to define a cantilever, and oxide layer 312 and top silicon layer 302 are etched to form a cantilever 316. Photoresist layer 313 is then removed (FIG. 3M). The shape of cantilever 316 is illustrated in the plan view of FIG. 3A-3, with the tip 307 being located near the point of the cantilever 316 and conductive region 311 and piezoresistor 309 forming a conductive path which includes tip 307. Cross section line 3M—3M indicates the section at which FIG. 3M is taken.

Figure 3O:
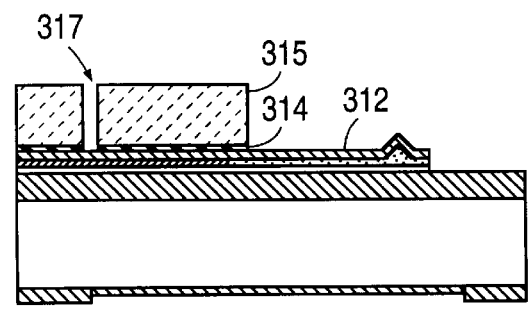
Figure 3P:
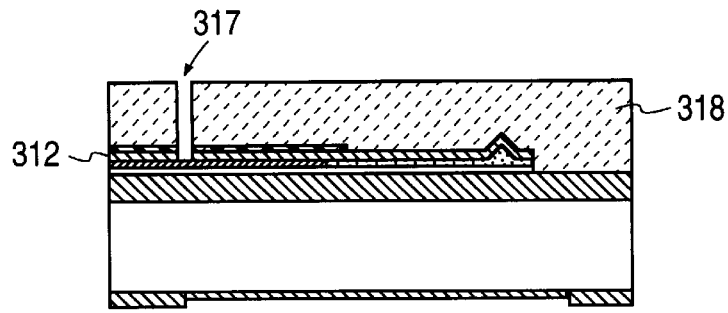

A nitride buffer layer 314 is deposited over the top surface of the structure. Buffer layer 314 is preferably a low stress PECVD nitride layer about 0.2 $\mu$m thick. A photoresist layer 315 is then deposited on top of buffer layer 314 and buffer layer 314 is etched so as to form a contact region 317. This step is illustrated in FIG. 3O. Photoresist layer 315 is preferably an AZ4620 photoresist, and an RIE (reactive ion etch) process is used to etch nitride buffer layer 314.

Photoresist layer 315 is stripped, and a new photoresist layer 318 is deposited so as to expose oxide layer 312 in contact region 317. Photoresist layer 318 is preferably AZ4620 photoresist. Oxide layer 312 is then etched, preferably using a 6:1 BOE solution for two minutes. Photoresist layer 318 is then stripped.

Figure 3Q:
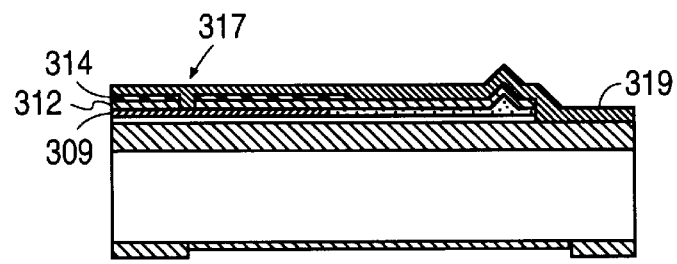

A first metal layer 319 is then deposited over the entire surface of the structure, filling contact region 317 and establishing a contact with conductive region 311. This step is illustrated in FIG. 3Q. First metal layer 319 is preferably formed by evaporating aluminum to a thickness of 0.5 $\mu$m on a cold substrate.

Figure 3R:
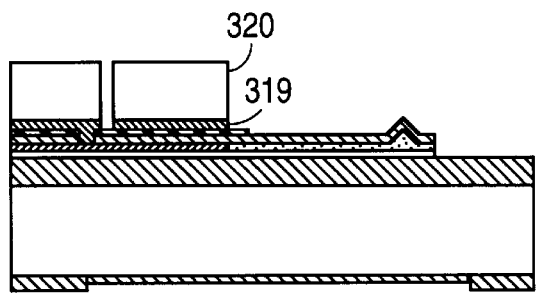

A photoresist layer 320 is deposited and first metal layer 319 is etched, as shown in FIG. 3R. In the preferred embodiment, the aluminum layer which forms first metal layer 319 is etched by a wet process. A plan view of first metal layer 319 is shown in FIG. 3A-4, which indicates the location of contact region 317 and a second contact region 317A formed opposite contact region 17. FIG. 3R is taken through the section line designated 3R—3R in FIG. 3A-4.

Figure 3S:
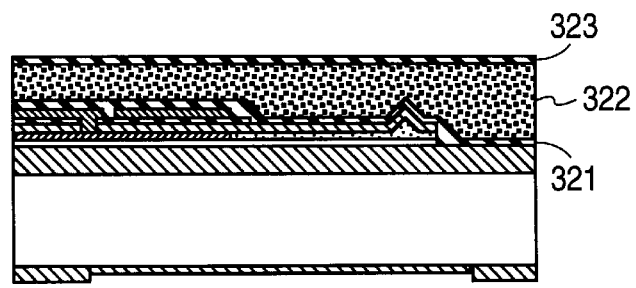

Referring next to FIG. 3S, after photoresist layer 320 has been stripped, a 0.2 $\mu$m thick PECVD nitride buffer layer 321, a 3.5 $\mu$m thick ZnO layer 322, and a 0.2 $\mu$m thick PECVD nitride buffer layer are deposited in succession over the top surface of the structure. The sandwich of ZnO layer 322 and nitride buffer layers 321 and 323 will form a piezoelectric element as described below. A pair of terminals 319T form an electrical contact to the bottom electrode of the piezoelectric element.

Figure 3T:
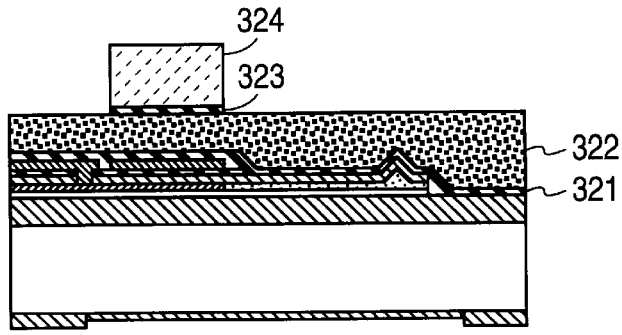
Figure 3U:
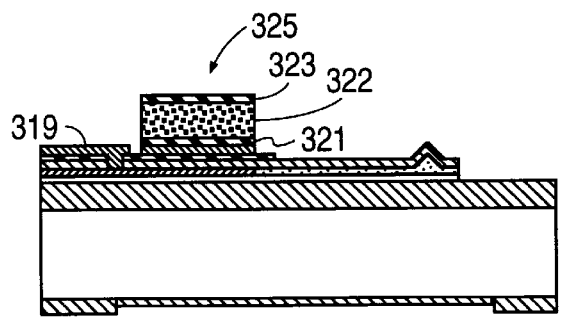

A thick photoresist layer 324 (preferably AZ4620) is then deposited and nitride buffer layer 323 is etched using an RIE etch. The resulting structure is shown in FIG. 3T. Using buffer layer 323 as a mask, ZnO layer 322 is then etched, and nitride layer 321 is RIE etched. After photoresist layer 321 is stripped in an oxygen plasma, the structure shown in FIG. 3U emerges. FIG. 3A-5 is a plan view of ZnO layer 322, with the cross section line 3U—3U denoting the section at which FIG. 3U is taken.

Figure 3V:
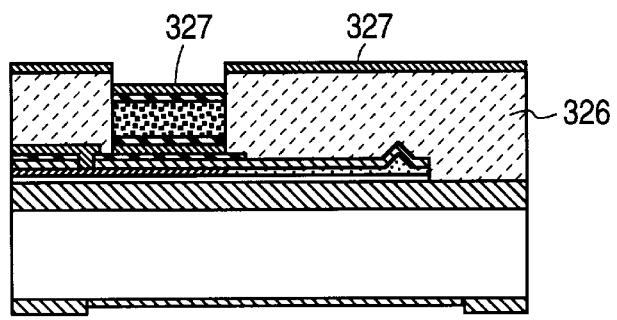

A photoresist layer 326 is then deposited as shown in FIG. 3V. Photoresist layer 326 is preferably a chlorobenzene treated AZ4620 photoresist. A second metal layer 327 is then deposited on the top surface of the structure, second metal layer 327 preferably being aluminum which is evaporated to a thickness of 0.5 microns. Photoresist layer 326 is then etched, lifting off a portion of second metal layer 327 and yielding the structure shown in FIG. 3W. As is evident from FIG. 3W, first metal layer 319 and second metal layer 325 form the bottom and top electrodes, respectively, of the ZnO piezoelectric element 325.

Figure 3W:
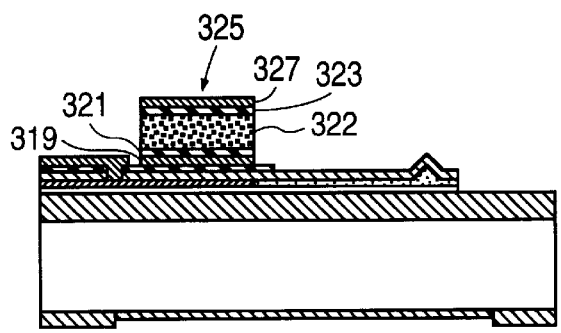

FIG. 3A-6 is a top view of the structure at this point, with cross section line 3W—3W indicating the section at which FIG. 3W is taken. As is apparent from FIG. 3A-6, second metal layer 327 extends to the sides of the structure in the region beyond the base of the cantilever 316. In these regions, ZnO layer 322 (FIG. 3A-5) merely acts as an insulating layer beneath second metal layer 325. A terminal 327T forms an electrical contact to the top electrode of piezoelectric element 325. A third metal layer (not shown) is then deposited on contact regions 317 and 317A, terminals 319T and terminal 327T to increase the thickness of the aluminum in these areas to at least 1.0 μm.

Next, as shown in FIG. 3X, a thick layer of PIQ 3600 polyimide (available from Hitachi) is spun on the top surface of this structure, preferably for 2 minutes at 500 RPM. The structure is then baked for 2 hours at 350° C. The bottom surface of the structure is then etched using an ethylene diamine and pyrocatechol (EDP) etch at 105° C., as shown in FIG. 3Y. EDP can be purchased as a premixed anisotropic silicon etchant. Other etchants such as tetramethyl ammonium hydroxide (TMAH) or hydrazine may also be used. The etchant used should be anisotropic and be highly selective against silicon dioxide and must not interfere with the circuitry. The result is to remove a portion of silicon layer 300, exposing the bottom surface of oxide layer 301.

Oxide layer 301 is then etched, preferably with a 6:1 BOE solution. This yields the structure shown in FIG. 3Z. Finally, polyimide layer 329 is removed freeing the cantilever 316 as shown in FIG. 3A-1.

For maximum efficiency, an array of cantilevers may be formed in each die of a wafer as described in application Ser. No. 08/296,340. As described there, each cantilever projects into a "window" in the die. The wafer containing the cantilevers is then juxtaposed to a wafer on which the transistors are to be fabricated.

Figure 5A:
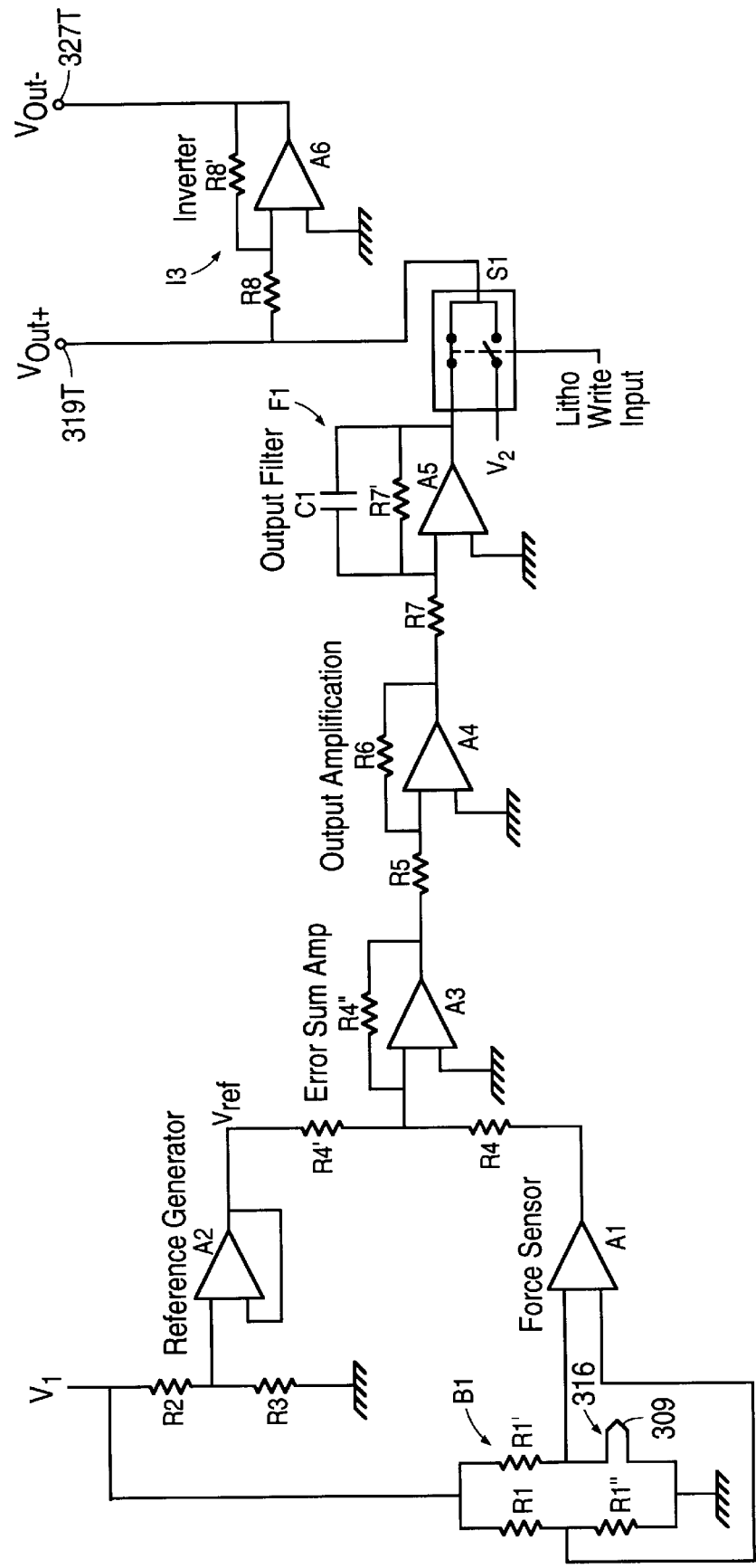
FIGS. 5A and 5B illustrate circuitry for controlling a cantilever of the kind shown in FIG. 1.
Figure 5B:
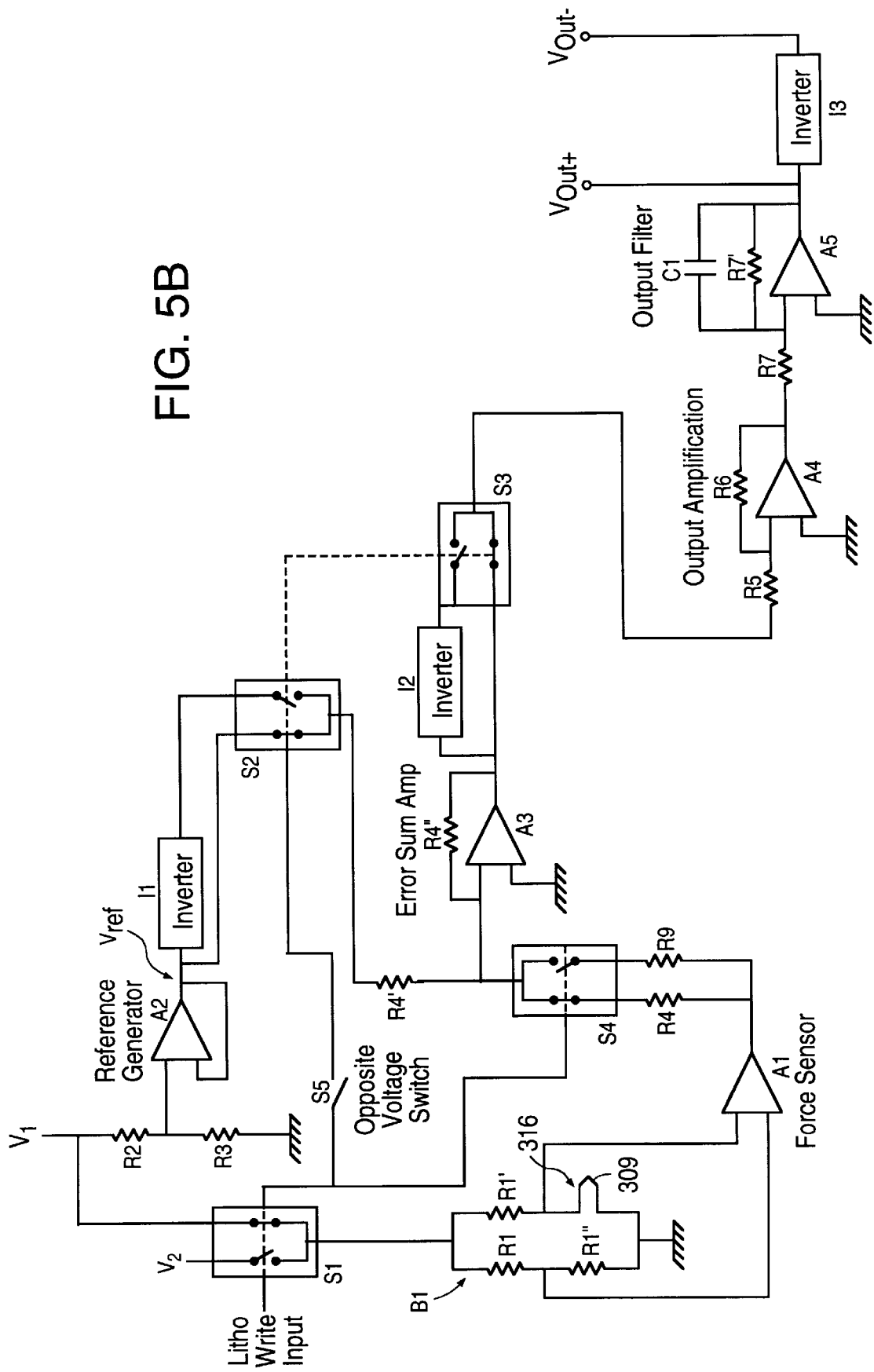
Figure 6:
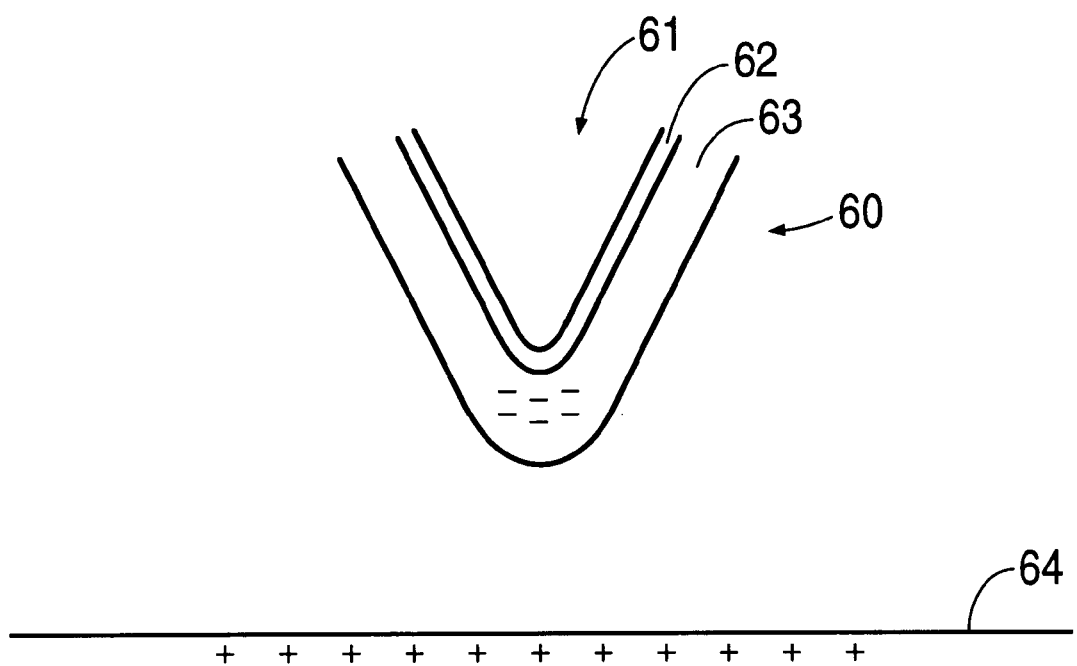

FIGS. 5A and 5B illustrate in schematic form the circuit that is used to control cantilever 316 during the lithographic process. It should be understood that the components illustrated in FIGS. 5A and 5B are fabricated in integrated form on board the wafer, with a corresponding control circuit being used to control separately each cantilever in the array. The manner of fabricating the individual components in FIGS. 4A and 4B in integrated circuit form is well known to those skilled in the art and will not be described here.

FIG. 5A illustrates a control circuit that is used to interrupt the write process (i.e., the exposure of the silicon by an electric field) by lifting the cantilever away from the surface. In this manner, the electric field ceases and the oxidation of the silicon is terminated. Piezoresistor 309 is connected in a bridge circuit B1 which is supplied by a constant voltage $V_1$. The bridge circuit includes resistors R1, R1' and R1", each of which is precision matched to piezoresistor 309. The value of resistors R1, R1' and R1" are set such that the voltage at the tip of the cantilever is equal to $V_1/4$. The outputs of the bridge circuit B1 are delivered to respective inputs of an amplifier A1, which is a high precision, high gain, low noise, operational amplifier. The voltage $V_1$ is also supplied to a voltage divider consisting of resistors R2 and R3, which are set to provide a voltage which is passed through a high precision operational amplifier A2 to provide a reference voltage $V_{ref}$. In FIGS. 4A and 4B, the resist layer and substrate are at system ground potential.

The outputs of amplifiers A1 and A2 are passed through matched resistors R4 and R4', respectively, to the input of an error sum amplifier A3, which provides a unity gain. A precision operational amplifier A4 amplifies the output of error sum amplifier A3, the gain being determined by resistors R5 and R6.

The signal is then passed through a low pass filter F1 which includes a capacitor C1, an operational amplifier A5, and resistors R7 and R7'. Amplifier A5 is an integrating operational amplifier which filters out high frequencies in order to maintain stability in the feedback loop while at the same time enhancing the feedback loop by using previously acquired information to "predict" new information (the feedback loop in this case includes the piezoelectric element 325, the operation of which affects the resistance of piezoresistor 309.) The integrator gain of amplifier A5, which determines the slope of changes in the output, is equal to $1/(R7 \times C1)$. The resistors R7 and R7' are set at the same value to keep the magnitude gain constant. (The magnitude gain is set in amplifier A4.) Therefore, capacitor C1 determines the integrator gain. If the value of C1 is increased, the integrator gain is decreased, causing amplifier A5 not to respond to frequencies above the gain (1/RC). Filtering of the high frequencies makes the feedback loop more stable but less sensitive. To enhance sensitivity, the integrator gain should be set as high as possible without making the feedback loop become unstable. Other factors which contribute to the maximum integrator gain are the scan speed, the gain of amplifier A4, and the topology of the imaged surface.

The output of filter F1 is passed through a double-pole switch S1 and to a pair of outputs $V_{Out+}$ and $V_{Out-}$. An inverter I3, containing an amplifier A6 and resistors R8 and R8' ensures that $V_{Out-}$ has the same absolute magnitude but opposite sign as $V_{Out+}$. $V_{Out+}$ and $V_{Out-}$ are delivered to terminals 319T and 327T shown in FIG. 3W1, which, as described above, are the poles of the piezoelectric element 325.

The other current path through switch S1 is connected to a constant voltage $V_2$. The voltage $V_2$ is set at a level such that when $V_{Out+}=V_2$ and $V_{out-}=-V_2$ the cantilever is bent away from the surface of the substrate. The lithographic write input is connected to switch S1 and, when activated, connects the output of filter F1 to terminals 319T and 327T.

When the cantilever is writing, the resistance of piezoresistor 309 varies as the cantilever flexes. Bridge circuit B1 therefore delivers varying outputs to amplifier A1. Error sum amplifier A3 compares the output of amplifier A1 against the reference voltage $V_{ref}$ and transmits the signal for amplification to amplifier A4. High frequency components of the signal are filtered by filter F1 and the resultant signal and its inverse are delivered to terminals 319T and 325T as $V_{Out+}$ and $V_{Out-}$. $V_{Out+}$ and $V_{Out-}$ are used for imaging purposes and also to control the piezoelectric element 325 so as to maintain a constant force between the tip 307 and the surface of the substrate. Thus, with switch S1 in this position, the cantilever operates in the manner of a conventional atomic force microscope.

As noted above, the voltage at the tip 307 is equal to $V_1$ divided by 4. $V_1$ is set such that $V_1/4$ is above the threshold (voltage that is required) to establish an electric field which causes silicon dioxide to form at the point where tip 307 makes contact with the surface of the silicon. To perform lithography by oxidation, the tip is normally negatively biased with respect to the silicon, and $V_1$ might be set at −28V, for example.

The control circuit shown in FIG. 5A may also be used to perform electric field lithography using charge trapped at the apex of the cantilever tip. FIG. 6 illustrates a detailed cross-sectional view of a cantilever tip 60. An underlying silicon tip 61 is covered by an oxide layer 62 and a nitride layer 63. Negative charge is trapped in the nitride layer 63 and produces an electric field between cantilever tip 60 and a substrate 64. This electric field may be used to perform lithography as described above.

The nitride-oxide-silicon (NOS) structure at the tip shown in FIG. 6 may be formed by depositing 50 Å of thermal oxide followed by 450 Å of silicon-nitride onto the bare silicon tip 61. The thermal oxide may be deposited at 800° C. for 30 minutes in dry oxygen, and the nitride may be deposited by a low pressure chemical vapor deposition process. Oxide layer 62 and nitride layer 63 may be deposited at any time after tip 61 has been sharpened and the piezoresistor has been implanted, as described above, but before the cantilevers are freed in the backside etch (FIG. 13Y). Preferably, this is done immediately after the tip is sharpened (FIGS. 10H and 10I). Oxide layer 62 and nitride layer 63 are deposited on the exposed cantilever and are removed from regions such as the contacts, piezoresistor and electrical circuitry where their presence might create a problem.

Nitride layer 63 is charged by placing it in contact with a conductor and creating a large bias (e.g., 25–40 volts) between the conductor and silicon tip 61. This bias causes charge from the silicon tip 61 to tunnel through the oxide layer 62 and become trapped in the nitride layer 63. Once the charge has been trapped in the nitride layer 63, the bias can be removed and the charge will remain fixed.

In one application, after the cantilever was completely fabricated the tip was brought into contact with a conducting substrate. A bias, either DC or pulse, was then applied to the conducting substrate to trap charge in the tip. The die, from which the cantilever was electrically isolated, was grounded, and the tip and cantilever were allowed to "float" electrically.

The bias needs to be applied only for several seconds, although it could be applied for longer. After the bias is removed and the cantilever is taken away from the conducting substrate, the cantilever is ready for lithography. This process can be repeated as necessary to replace any charge that leaks from the nitride layer.

This embodiment eliminates the need for a conductive path to the tip (see e.g., conductive path 201 in FIG. 12). Lithography is performed by causing the cantilever to which tip 60 is attached to bend away from the substrate 64, as described above, using the circuitry shown in FIG. 5A.

FIG. 5B shows a control circuit that is used to perform lithography by controlling the bias of the tip. Many of the components shown in FIG. 5B are the same as those shown in FIG. 5A and are similarly designated. In FIG. 5B, switch S1 is connected such that $V_1$ is applied to the bridge B1 when the switch is in one position and $V_2$ is applied to bridge B1 when the switch is in the other position. Switch S1 is ganged with a switch S4 and through a manually operated, opposite voltage switch S5 with switches S2 and S3. Opposite voltage switch S5 is closed when $V_1$ and $V_2$ have opposite signs and open when they have the same sign.

Switch S2 allows the output of amplifier A2 to be passed through an inverter I1 before it is delivered through resistor R4' to an input of error sum amplifier A3. Switch S3 allows the output of error sum amplifier A3 to be inverted before it is passed to an input of amplifier A4. Switch S4 allows the output of amplifier A1 to be passed through a resistor R9 to an input of error sum amplifier A3. The value of resistor R9 is set such that the following relationship holds:

$$\frac{R4}{R9} = \frac{V_1}{V_2}$$

The operation of this circuit will be described first in the situation where $V_1$ and $V_2$ have the same polarity (i.e., the opposite voltage switch S5 is open). In this condition, switches S2 and S3 are in the state shown in the drawing (i.e., inverters I1 and I2 are not operative). $V_2$ is set such that $V_2/4$, which in the voltage at the tip, exceeds whatever threshold voltage is required to cause lithography to be performed. Typically, lithography by oxidation takes place with the tip biased negatively with respect to the substrate. $V_1$ is set such that $V_1/4$ is below the applicable threshold voltage.

When the switches S1 and S4 are in the position shown in FIG. 5B, the circuit operates exactly like the circuit of FIG. 5A in the imaging (non-lithographic) mode. When switch S1 is thrown to connect $V_2$ to the bridge circuit B1, the voltage at the tip exceeds the applicable threshold and lithography is performed. In this situation, switch S4 connects resistor R9 into the circuit between the output of amplifier A1 and the input of amplifier A3. Since, as described above, $$\frac{R4}{R9} = \frac{V_1}{V_2},$$

switching $R_9$ into the circuit compensates for the difference between $V_1$ and $V_2$ and ensures that the voltage at the input of amplifier A3 will remain constant. As a result, a consistent signal is delivered to terminals 319T and 327T, assuring that the piezoelectric element 325 receives the same input signal.

When $V_1$ and $V_2$ are of opposite polarity, the opposite voltage switch S5 is closed. With switch S5 closed, the $V_{ref}$ output of amplifier A2 is passed through inverter I1, and this adjusts for the change of polarity at the input of error sum amplifier A3. Similarly, the polarity of the output of amplifier A3 is corrected by passing it through inverter I2. Thus, switches S2 and S3 correct for the difference in polarity between $V_1$ and $V_2$. As described above, switch S4 corrects for the difference in the absolute values of $V_1$ and $V_2$. Again, switches S2, S3 and S4, together assure that the piezoelectric element 325 receives the same input regardless of the state of switch S1.

A cantilever in accordance with this embodiment of the invention may also be operated in the "attractive" or non-contact mode. In this mode, a superimposed AC/DC signal is applied to the piezoelectric element 325, causing it to vibrate at a specified frequency. As described above, when the tip is brought very close to the surface, the actual frequency of vibration is dependent on the gradient of Van der Waals or other forces which exist between the tip and the substrate. The actual frequency of vibration is detected by the piezoresistor 309, and this is used to maintain a desired separation between the tip and the surface. The separation between the tip and the surface is adjusted by varying the DC component of the signal delivered to the piezoelectric element 325. Circuitry similar to that shown in FIGS. 5A and 5B is used to perform lithography with the cantilever.

While specific embodiments according to this invention have been described above, it will be apparent from the foregoing that a wide variety of alternative embodiments could be designed and fabricated without departing from the broad principles of this invention. For example, while the fabrication of a gate of a MOSFET has been described, other features of a field-effect-transistor such as the gate contact region, contact holes, and metal could be fabricated by applying amorphous silicon instead of photoresist, patterning the amorphous silicon in the manner described within this application, using the amorphous silicon as a mask to transfer the pattern onto the desired material (oxide or metal), and removing the amorphous silicon. Moreover, features of electronic devices other than NMOSFETS, including PMOSFETs, CMOSFETs, BiCMOSFETs, junction field-effect transistors (JFETs), bipolar junction transistors (BJTs), thin film transistors (TFTs), surrounding gate transistors, depleted lean-channel transistors and single electron transistors could also be fabricated using the unique features of this invention. Accordingly, it is intended that this invention, as defined in the following claims, cover all such embodiments.

We claim:

1. A method of fabricating an electronic device, said method comprising the steps of:
    providing a substrate;
    providing a scanning probe microscope, said microscope comprising a cantilever and a tip near a free end of said cantilever;
    forming a first layer over a surface of said substrate, said first layer comprising an oxide;
    depositing a second layer over said first layer, said second layer comprising a material selected from the group which consists of silicon and the metals;
    causing said cantilever to approach said second layer until said tip is near a surface of said second layer;
    causing said cantilever to vibrate;
    detecting a frequency at which said cantilever vibrates and using a signal representative of said frequency to adjust a distance between said tip and the surface of said second layer;
    scanning said tip over the surface of said second layer;
    creating an electric field between said tip and the surface of said second layer so as to form an oxide pattern on said surface of the second layer.

2. The method of claim 1 further comprising the step of etching said second layer in an area not covered by said oxide pattern, a portion of said second layer remaining beneath said oxide pattern forming a feature of said device.

3. The method of claim 2 wherein said feature comprises a gate of a MOSFET.

4. The method of claim 3 wherein said feature further comprises a gate contact pad adjoining said gate.

5. The method of claim 3 further comprising the step of depositing a layer of photoresist on the surface of said second layer, exposing said photoresist to light radiation through a mask, developing said photoresist, and etching said second layer so as to form a gate contact pad adjoining said gate.

6. The method of claim 3 further comprising implanting dopant through the surface of said substrate, while using said gate as a mask, so as to form source/drain regions of said MOSFET.

7. The method of claim 6 wherein the length of said gate is no greater than 0.2 $\mu$m.

8. The method of claim 1 wherein said step of forming a second layer comprises forming a layer which comprises amorphous silicon.

9. The method of claim 1 wherein said step of forming a second layer comprises forming a layer which comprises polysilicon.

10. The method of claim 1 wherein said step of forming a second layer comprises forming a layer which comprises a metal.

11. The method of claim 1 wherein said step of providing a scanning probe microscope comprises providing an atomic force microscope.

12. The method of claim 1 wherein the cantilever comprises a piezoresistor, the step of detecting a frequency at which said cantilever vibrates being performed by detecting the resistance of the piezoresistor.

13. The method of claim 1 wherein the cantilever comprises a piezoelectric element, the step of causing said cantilever to vibrate comprising the step of applying an oscillating electric signal to said piezoelectric element.

14. The method of claim 1 wherein the cantilever comprises a piezoelectric element, the step of adjusting a distance between said tip and the surface of said second layer comprising the step of applying a signal to said piezoelectric element.

15. A method of fabricating a transistor or other electronic device, said method comprising the steps of:
    providing a substrate;
    depositing a first layer over said substrate, said first layer comprising a material selected from the group consisting of silicon and the metals;
    providing a scanning probe microscope, said microscope comprising a flexible cantilever and a tip near a free end of said cantilever;
    biasing said substrate to a first voltage;
    biasing said tip to a second voltage;
    scanning said cantilever over a surface of said first layer while repeatedly causing said cantilever to bend away from said surface, thereby lifting said tip to a first position removed from said surface, and repeatedly causing said cantilever to bend towards said surface, thereby bringing said tip to a second position adjacent said surface, an electric field extending from said tip to said surface when said tip is in said second position thereby causing an oxide layer to be formed on said surface, said electric field being interrupted when said tip is in said first position such that no oxide layer is formed on said surface, the bending of said cantilever between said first and second positions causing said oxide layer to be formed in a pattern on said substrate; and
    etching a first portion of said first layer not covered by said oxide layer, a second portion of said first layer remaining beneath said oxide layer forming a feature of said device.

16. The method of claim 15 wherein said step of biasing said tip to said second voltage comprises connecting a voltage source to said tip via a conductive path in said cantilever.

17. The method of claim 15 wherein said step of biasing said tip to said second voltage comprises causing a charge to be trapped at said tip.

18. The method of claim 15 wherein said step of depositing a first layer comprises depositing a layer which comprises amorphous silicon.

19. The method of claim 15 wherein said step of depositing a first layer comprises depositing a layer which comprises polysilicon.

20. The method of claim 15 wherein said step of depositing a first layer comprises depositing a layer which comprises a metal.

21. The method of claim 15 wherein said feature comprises a gate of a MOSFET.

22. The method of claim 21 wherein said feature further comprises a gate contact pad adjoining said gate.

23. The method of claim 21 further comprising depositing a layer of photoresist on said surface of said first layer, exposing said photoresist to light radiation through a mask, developing said photoresist, and etching said first layer so as to form a gate contact pad adjoining said gate.

24. The method of claim 21 further comprising implanting dopant through the surface of said substrate, while using said gate as a mask, so as to form source/drain regions of said MOSFET.

25. The method of claim 24 wherein the length of said gate is no greater than 0.2 µm.

26. A method of fabricating a gate of a MOSFET comprising the steps of:

providing a silicon substrate;

providing an atomic force microscope having a cantilever and a tip near a free end of said cantilever;

forming a gate oxide layer on said silicon substrate;

depositing an amorphous silicon layer on said gate oxide layer;

causing said cantilever to approach said amorphous silicon layer until said tip is near a surface of said amorphous silicon layer;

causing said cantilever to vibrate;

detecting a frequency at which said cantilever vibrates and using a signal representative of said frequency to adjust a distance between said tip and the surface of said amorphous silicon layer;

scanning said tip over said layer of amorphous silicon while repeatedly creating and extinguishing an electric field between said tip and said amorphous silicon layer, the electric field causing an oxide pattern to form on said amorphous silicon layer;

etching a portion of said amorphous silicon layer not cover by said oxide pattern to form said gate; and converting said amorphous silicon layer to polysilicon.

27. The method of claim 26 wherein said step of forming a gate oxide layer comprises a thermal process.

28. The method of claim 26 wherein said step of forming a gate oxide comprises scanning said tip over said silicon substrate.

29. The method of claim 26 further comprising the step of forming a gate contact pad adjoining said gate.

30. The method of claim 29 wherein said step of forming a gate contact pad comprises a process which includes photolithography.

31. The method of claim 29 wherein said step of scanning said tip over said layer of amorphous silicon comprises said step of forming a gate contact pad.

32. A method of fabricating an electronic device, said method comprising the steps of:

providing a substrate;

depositing a metal layer above said substrate, said metal layer comprising a metal selected from the group which consists of chromium, titanium and aluminum;

providing a scanning probe microscope, said microscope comprising a cantilever and a tip near a free end of said cantilever;

scanning said tip over a surface of said metal layer;

creating and extinguishing an electric field between said tip and said surface so as to form a oxide pattern on said surface.

33. The method of claim 32 further comprising the step of etching a first portion of said metal layer, a second portion of said layer remaining beneath said oxide pattern forming a feature of said device.

34. A method of fabricating an electronic device, said method comprising the steps of:

providing a substrate;

depositing a layer above said substrate;

providing a scanning probe microscope, said microscope comprising a flexible cantilever and a tip near a free end of said cantilever;

trapping electric charge at said tip so as to bias said tip;

scanning said cantilever over a surface of said layer while repeatedly causing said cantilever to bend away from said surface, thereby lifting said tip to a first position removed from said surface, and repeatedly causing said cantilever to bend towards said surface, thereby bringing said tip to a second position adjacent said surface, an electric field extending from said tip to said surface when said tip is in said second position thereby causing an oxide layer to be formed on said surface, said electric field being interrupted when said tip is in said first position such that no oxide layer is formed on said surface, the bending of said cantilever between said first and second positions causing said oxide layer to be formed in a pattern on said substrate.

35. The method of claim 34 comprising the further step of etching a first portion of said layer, a second portion of said layer remaining beneath said oxide layer forming a feature of said device.

* * * * *